United States Patent
Kurosawa et al.

(10) Patent No.: US 7,589,515 B2
(45) Date of Patent: Sep. 15, 2009

(54) METHOD FOR REDUCING TEMPERATURE-DEPENDENT ERROR IN PHOTOCURRENT SENSOR, AND PHOTOCURRENT SENSOR DEVICE

(75) Inventors: Kiyoshi Kurosawa, Chiyoda-ku (JP); Kazuomi Shirakawa, Chiyoda-ku (JP)

(73) Assignee: The Tokyo Electric Power Company, Incorporated, Tokyo (JP)

( * ) Notice: Subject to any disclaimer, the term of this patent is extended or adjusted under 35 U.S.C. 154(b) by 155 days.

(21) Appl. No.: 11/574,249

(22) PCT Filed: Aug. 17, 2005

(86) PCT No.: PCT/JP2005/015004
§ 371 (c)(1),
(2), (4) Date: Apr. 24, 2007

(87) PCT Pub. No.: WO2006/022178
PCT Pub. Date: Mar. 2, 2006

(65) Prior Publication Data
US 2007/0273358 A1 Nov. 29, 2007

(30) Foreign Application Priority Data
Aug. 25, 2004 (JP) .............................. 2004-245843

(51) Int. Cl.
- G01R 31/00 (2006.01)
- G01R 1/44 (2006.01)
- G01R 33/02 (2006.01)
- G01R 31/302 (2006.01)
- G02F 1/00 (2006.01)
- G02F 1/01 (2006.01)
- G02F 1/03 (2006.01)

(52) U.S. Cl. .................. 324/96; 324/105; 324/244.1; 324/750; 359/237; 359/240; 359/245

(58) Field of Classification Search .............. 324/96, 324/105, 237–245, 750; 359/237–245
See application file for complete search history.

(56) References Cited

U.S. PATENT DOCUMENTS

| 4,984,875 | A | | 1/1991 | Abe et al. |
|---|---|---|---|---|
| 5,764,046 | A | * | 6/1998 | Bosselmann .................. 324/96 |
| 5,811,964 | A | * | 9/1998 | Bosselmann et al. .......... 324/96 |
| 2002/0011831 | A1 | * | 1/2002 | Minier ......................... 324/96 |
| 2005/0083033 | A1 | | 4/2005 | Kurosawa et al. |

FOREIGN PATENT DOCUMENTS

| EP | 0353057 A2 | 1/1990 |
|---|---|---|
| JP | 57-120864 A | 7/1982 |
| JP | 2-38880 A | 2/1990 |
| JP | 8-510056 A | 10/1996 |
| JP | 2000-266787 A | 9/2000 |
| WO | 9510046 A1 | 4/1995 |
| WO | 03075018 A1 | 9/2003 |

OTHER PUBLICATIONS

Relevant portion of International Search Report of PCT/JP2005/015004.

* cited by examiner

*Primary Examiner*—Ha Tran T Nguyen
*Assistant Examiner*—Karen M Kusumakar
(74) *Attorney, Agent, or Firm*—Rossi, Kimms & McDowell, LLP

(57) ABSTRACT

[Problem] To permit reduction in the temperature dependence of a sensor, which is ascribable to the temperature dependence of the Verdet constant of a sensor fiber, at a low cost.

[Means for Resolution] In a prior-art optical sensor fiber of reflection type, reduction in the temperature dependence of a sensor is coped with by, e.g., duplexing a signal processing circuit and a receiving optical system, so as to execute the mean processing of modulation signals, whereas in this invention, the elimination of the temperature dependence of a modulation signal is realized by selecting a ferromagnetic Faraday rotor 13 so that a modulation degree ($S_{out}$) expressed by the ratio between an AC component and a DC component may become constant or within a certain range, so as to especially simplify a configuration and to attain a lower cost.

15 Claims, 15 Drawing Sheets

FIG. 2
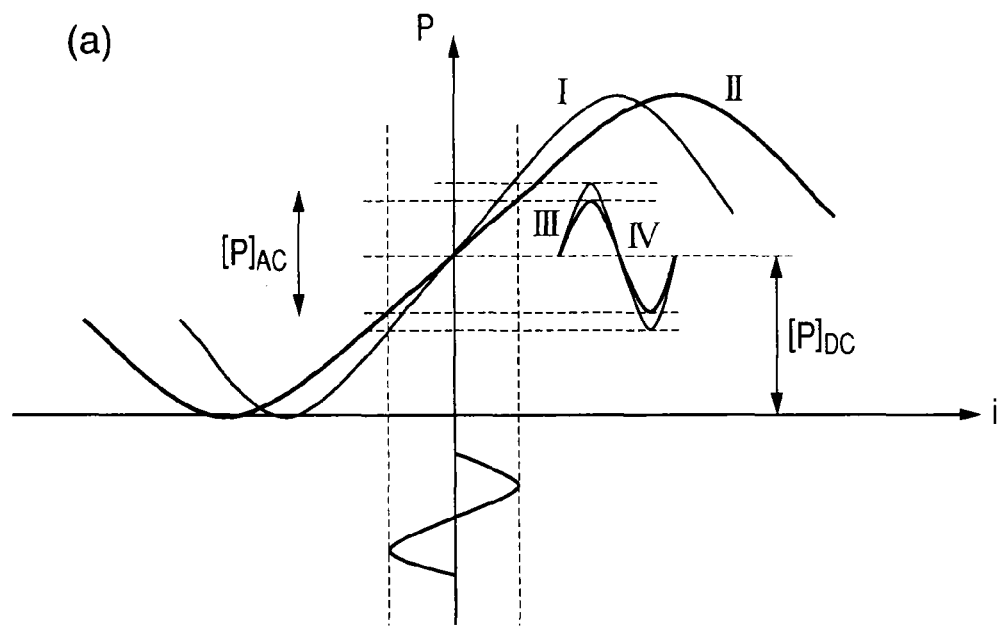
(a)
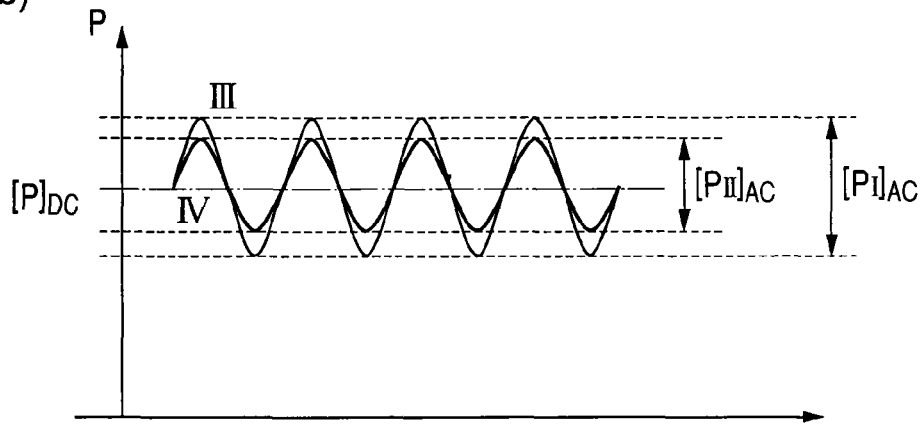
(b)
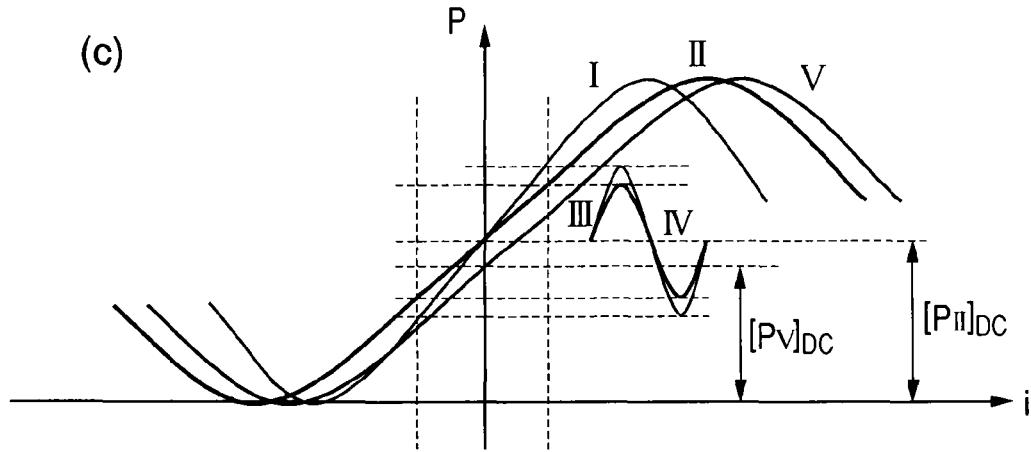
(c)

FIG. 7

| SIGN OF $\alpha$ | \multicolumn{2}{c|}{$0 \leq \alpha$} | \multicolumn{2}{c|}{$\alpha \leq 0$} |
|---|---|---|---|---|
| SIGNAL TO-BE-SELECTED | $S_A$ | $S_B$ | $S_A$ | $S_B$ |
| CONDITIONAL FORMULA | $0 \leq |\alpha + 4\beta F_{sd}| \leq |\alpha|$ | $0 \leq |\alpha - 4\beta F_{sd}| \leq |\alpha|$ | $0 \leq |\alpha + 4\beta F_{sd}| \leq |\alpha|$ | $0 \leq |\alpha - 4\beta F_{sd}| \leq |\alpha|$ |
| TEMPERATURE DEPENDENCE OF OUTPUT: PLUS | $-|\alpha|/4d \leq \beta F_S \leq 0$ | $0 \leq \beta F_S \leq |\alpha|/4d$ | $|\alpha|/4d \leq \beta F_S \leq |\alpha|/2d$ | $-|\alpha|/2d \leq \beta F_S \leq -|\alpha|/4d$ |
| TEMPERATURE DEPENDENCE OF OUTPUT: MINUS | $-|\alpha|/2d \leq \beta F_S \leq -|\alpha|/4d$ | $|\alpha|/4d \leq \beta F_S \leq |\alpha|/2d$ | $0 \leq \beta F_S \leq |\alpha|/4d$ | $-|\alpha|/4d \leq \beta F_S \leq 0$ |
| VALID OVERALL RANGE | $-|\alpha|/2d \leq \beta F_S \leq 0$ | $0 \leq \beta F_S \leq |\alpha|/2d$ | $0 \leq \beta F_S \leq |\alpha|/2d$ | $-|\alpha|/2d \leq \beta F_S \leq 0$ |

FIG. 8
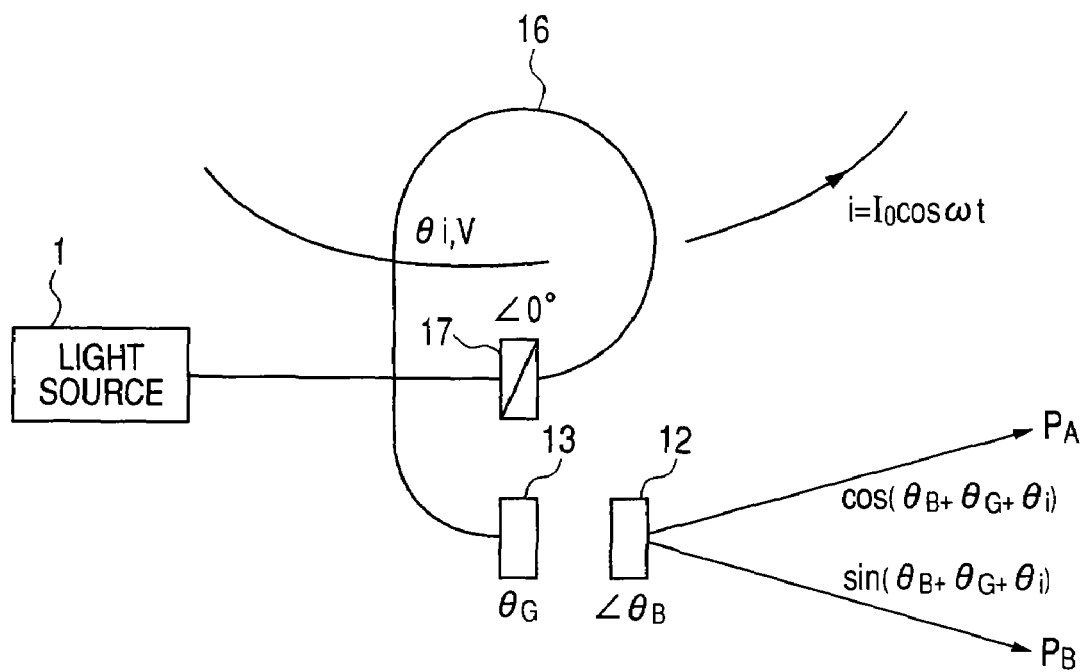
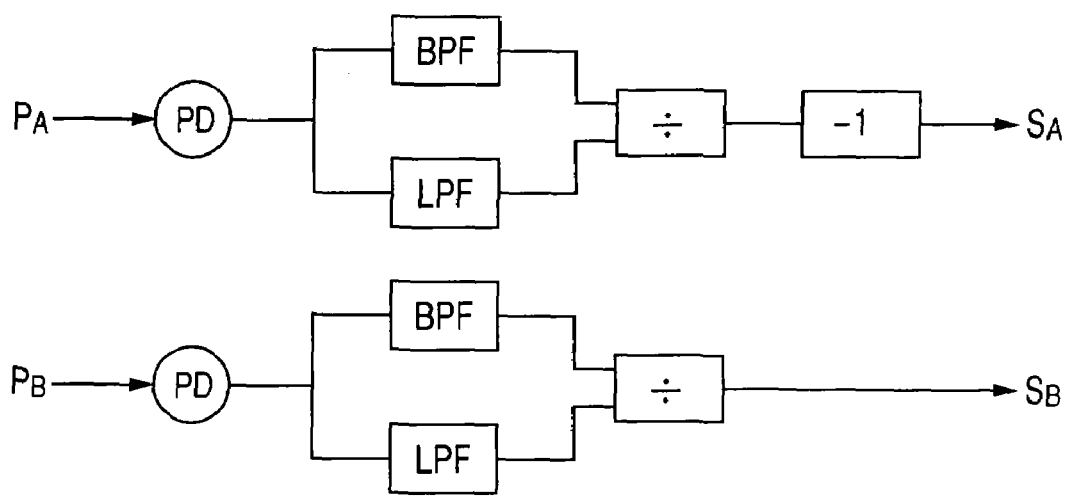

ENTRANCE POLARIZED LIGHT AZIMUTH

| PARAMETER \ SIGN | | | | | | | | |
|---|---|---|---|---|---|---|---|---|
| α | (+) | | | | (−) | | | |
| Fs | (+) | | (−) | | (+) | | (−) | |
| β | (+) | (−) | (+) | (−) | (+) | (−) | (+) | (−) |
| SIGNAL TO-BE-SELECTED | S_B | S_A | S_A | S_B | S_A | S_B | S_B | S_A |

FIG. 11

| SIGN OF $\alpha$ | $0 \leq \alpha$ | | $\alpha \leq 0$ | |
|---|---|---|---|---|
| SIGNAL TO-BE-SELECTED | $S_A$ | $S_B$ | $S_A$ | $S_B$ |
| CONDITIONAL FORMULA | $0 \leq \|\alpha + 2\beta F_S d\| \leq \|\alpha\|$ | $0 \leq \|\alpha - 2\beta F_S d\| \leq \|\alpha\|$ | $0 \leq \|\alpha + 2\beta F_S d\| \leq \|\alpha\|$ | $0 \leq \|\alpha - 2\beta F_S d\| \leq \|\alpha\|$ |
| TEMPERATURE DEPENDENCE OF OUTPUT: PLUS | $-\|\alpha\|/2d \leq \beta F_S \leq 0$ | $0 \leq \beta F_S \leq \|\alpha\|/2d$ | $\|\alpha\|/2d \leq \beta F_S \leq \|\alpha\|/d$ | $-\|\alpha\|/d \leq \beta F_S \leq -\|\alpha\|/2d$ |
| TEMPERATURE DEPENDENCE OF OUTPUT: MINUS | $\|\alpha\|/2d \leq \beta F_S \leq \|\alpha\|/d$ | $\|\alpha\|/2d \leq \beta F_S \leq \|\alpha\|/d$ | $0 \leq \beta F_S \leq \|\alpha\|/2d$ | $-\|\alpha\|/2d \leq \beta F_S \leq 0$ |
| VALID OVERALL RANGE | $-\|\alpha\|/d \leq \beta F_S \leq 0$ | $0 \leq \beta F_S \leq \|\alpha\|/d$ | $0 \leq \beta F_S \leq \|\alpha\|/d$ | $-\|\alpha\|/d \leq \beta F_S \leq 0$ |

FIG. 12

| OPTICAL BIAS: PLUS    $F_{sd}=\pi/8$ | OPTICAL BIAS: MINUS    $F_{sd}=-\pi/8$ |
|---|---|
| $S_A=(1+\alpha T)\cdot 4V_sI_0\cos\omega t/(1-4\beta F_{sd}T)$ | $S_A=-(1+\alpha T)\cdot 4V_sI_0\cos\omega t/(1+4\beta F_{sd}T)$ |
| $S_B=(1+\alpha T)\cdot 4V_sI_0\cos\omega t/(1+4\beta F_{sd}T)$ | $S_B=-(1+\alpha T)\cdot 4V_sI_0\cos\omega t/(1-4\beta F_{sd}T)$ |

FIG. 13

| PARAMETER \ SIGN | | | |
|---|---|---|---|
| $\alpha$ | (+) | (+) | (−) |
| $F_S$ | (−) | (−) | (−) |
| $\beta$ | (+) | (−) | (−) |
| SIGNAL TO-BE-SELECTED | $S_B$ | $S_A$ | $S_A$ | $S_B$ |

FIG. 14

| SIGN OF $\alpha$ | $0 \leq \alpha$ | | $\alpha \leq 0$ | |
|---|---|---|---|---|
| SIGNAL TO-BE-SELECTED | $S_A$ | $S_B$ | $S_A$ | $S_B$ |
| CONDITIONAL FORMULA | $0 \leq \|\alpha - 4\beta F_S d\| \leq \|\alpha\|$ | $0 \leq \|\alpha + 4\beta F_S d\| \leq \|\alpha\|$ | $0 \leq \|\alpha - 4\beta F_S d\| \leq \|\alpha\|$ | $0 \leq \|\alpha + 4\beta F_S d\| \leq \|\alpha\|$ |
| TEMPERATURE DEPENDENCE OF OUTPUT: PLUS | $0 \leq \beta F_S \leq \|\alpha\|/4d$ | $-\|\alpha\|/4d \leq \beta F_S \leq 0$ | $-\|\alpha\|/2d \leq \beta F_S \leq -\|\alpha\|/4d$ | $\|\alpha\|/4d \leq \beta F_S \leq \|\alpha\|/2d$ |
| TEMPERATURE DEPENDENCE OF OUTPUT: MINUS | $\|\alpha\|/4d \leq \beta F_S \leq \|\alpha\|/2d$ | $-\|\alpha\|/2d \leq \beta F_S \leq -\|\alpha\|/4d$ | $-\|\alpha\|/4d \leq \beta F_S \leq 0$ | $0 \leq \beta F_S \leq \|\alpha\|/4d$ |
| VALID OVERALL RANGE | $0 \leq \beta F_S \leq \|\alpha\|/2d$ | $-\|\alpha\|/2d \leq \beta F_S \leq 0$ | $-\|\alpha\|/2d \leq \beta F_S \leq 0$ | $0 \leq \beta F_S \leq \|\alpha\|/2d$ |

FIG. 15

| OPTICAL BIAS: PLUS $\theta_B+F_{SD}=\pi/4$ | OPTICAL BIAS: MINUS $\theta_B+F_{SD}=-\pi/4$ |
|---|---|
| $S_A=(1+\alpha T)\cdot 2V_sI_0\cos\omega t/(1-2\beta F_{sd}T)$ | $S_A=-(1+\alpha T)\cdot 2V_sI_0\cos\omega t/(1+2\beta F_{sd}T)$ |
| $S_B=(1+\alpha T)\cdot 2V_sI_0\cos\omega t/(1+2\beta F_{sd}T)$ | $S_B=-(1+\alpha T)\cdot 2V_sI_0\cos\omega t/(1-2\beta F_{sd}T)$ |

FIG. 16

| PARAMETER \ SIGN | | | | | | | |
|---|---|---|---|---|---|---|---|
| $\alpha$ | (+) | (+) | (+) | (+) | (−) | (−) | (−) | (−) |
| $F_s$ | (+) | (+) | (−) | (−) | (+) | (+) | (−) | (−) |
| $\beta$ | (+) | (−) | (+) | (−) | (+) | (−) | (+) | (−) |
| SIGNAL TO-BE-SELECTED | $S_A$ | $S_B$ | $S_B$ | $S_A$ | $S_B$ | $S_A$ | $S_A$ | $S_B$ |

FIG. 17

| SIGN OF α | 0 ≤ α | | α ≤ 0 | |
|---|---|---|---|---|
| SIGNAL TO-BE-SELECTED | $S_A$ | $S_B$ | $S_A$ | $S_B$ |
| CONDITIONAL FORMULA | $0 \leq \lvert \alpha - 2\beta F_{sd} \rvert \leq \lvert \alpha \rvert$ | $0 \leq \lvert \alpha + 2\beta F_{sd} \rvert \leq \lvert \alpha \rvert$ | $0 \leq \lvert \alpha - 2\beta F_{sd} \rvert \leq \lvert \alpha \rvert$ | $0 \leq \lvert \alpha + 2\beta F_{sd} \rvert \leq \lvert \alpha \rvert$ |
| TEMPERATURE DEPENDENCE OF OUTPUT: PLUS | $0 \leq \beta F_s \leq \lvert \alpha \rvert/2d$ | $-\lvert \alpha \rvert/2d \leq \beta F_s \leq 0$ | $-\lvert \alpha \rvert/d \leq \beta F_s \leq -\lvert \alpha \rvert/2d$ | $\lvert \alpha \rvert/2d \leq \beta F_s \leq \lvert \alpha \rvert/d$ |
| TEMPERATURE DEPENDENCE OF OUTPUT: MINUS | $\lvert \alpha \rvert/2d \leq \beta F_s \leq \lvert \alpha \rvert/d$ | $-\lvert \alpha \rvert/d \leq \beta F_s \leq -\lvert \alpha \rvert/2d$ | $-\lvert \alpha \rvert/2d \leq \beta F_s \leq 0$ | $0 \leq \beta F_s \leq \lvert \alpha \rvert/2d$ |
| VALID OVERALL RANGE | $0 \leq \beta F_s \leq \lvert \alpha \rvert/d$ | $-\lvert \alpha \rvert/d \leq \beta F_s \leq 0$ | $-\lvert \alpha \rvert/d \leq \beta F_s \leq 0$ | $0 \leq \beta F_s \leq \lvert \alpha \rvert/d$ |

FIG. 21
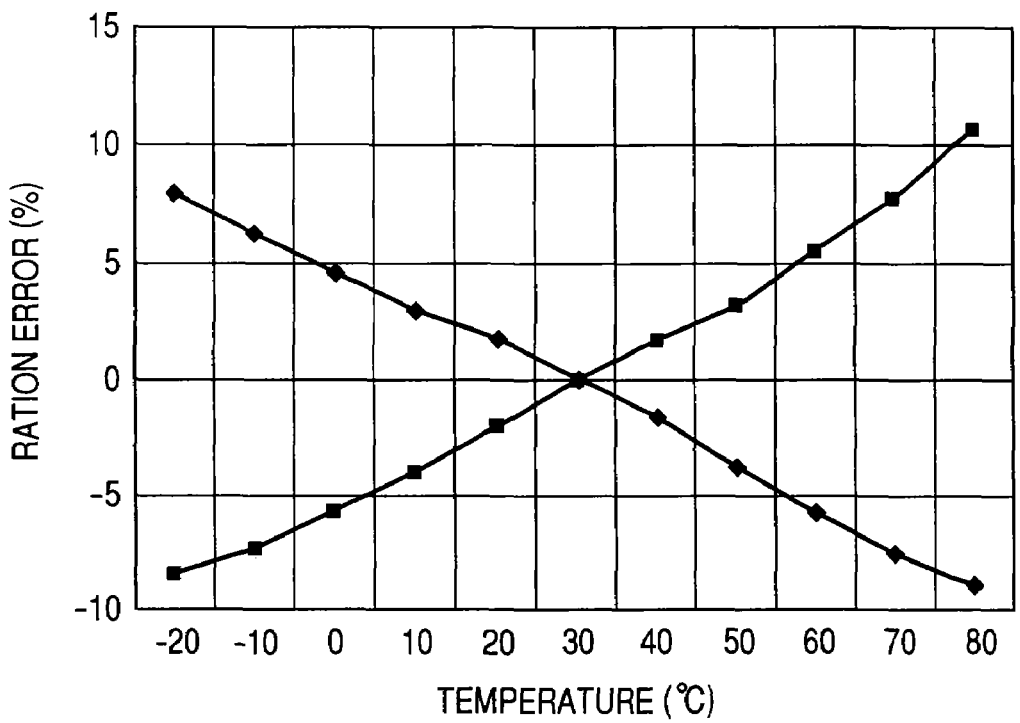
(a)
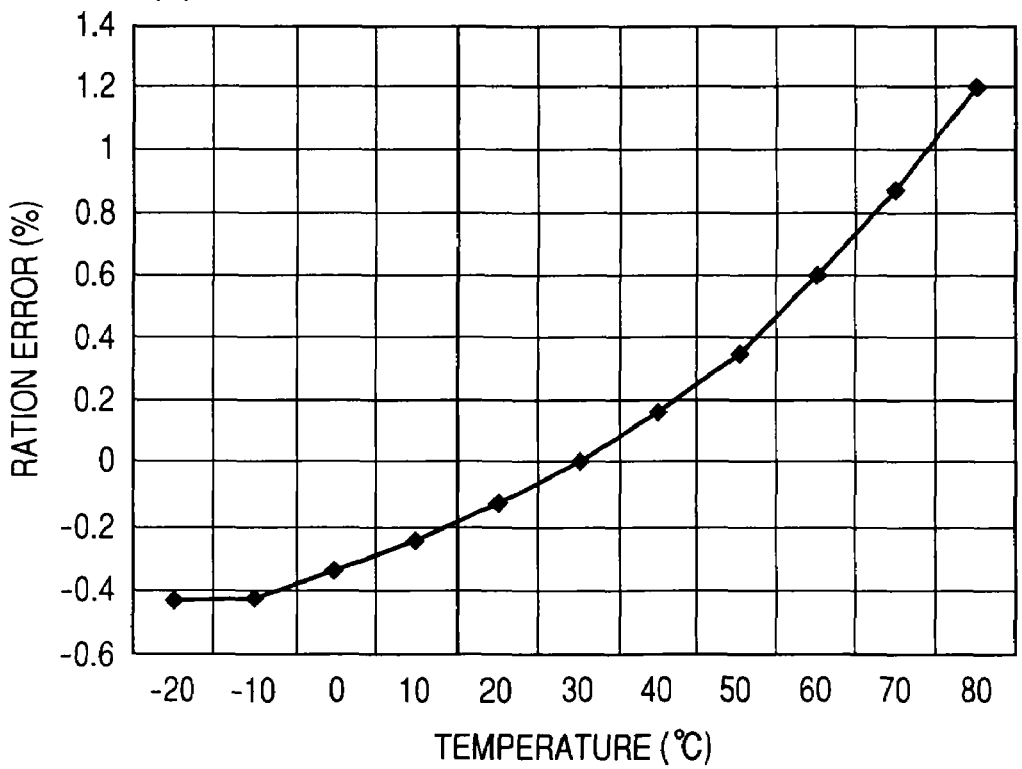
(b)

METHOD FOR REDUCING TEMPERATURE-DEPENDENT ERROR IN PHOTOCURRENT SENSOR, AND PHOTOCURRENT SENSOR DEVICE

TECHNICAL FIELD

This invention relates to a photocurrent sensor, and more particularly to a method for reducing a temperature-dependent error in a photocurrent sensor which measures an AC current by utilizing a magnetooptic effect such as Faraday effect, and a photocurrent sensor device which is used in this method.

BACKGROUND ART

It is expected by utilizing the Faraday effect of an optical fiber to realize a current sensor (optical fiber current sensor) which has various advantages such as a small size, a flexibility, an electromagnetic noise immunity, a long-distance signal transmission and a withstand voltage. Therefore, the researches and developments of optical fiber current sensors have been carried forward over a long term of years by many institutions. Among them, as a typical developed example, there is a scheme characterized in that a lead glass fiber is employed for a sensor fiber and that a mirror is arranged at one end of the sensor fiber, that is, a lead glass fiber photocurrent sensor of reflection type as disclosed in Patent Document 1.

The configuration of the device disclosed in Patent Document 1 is shown in FIG. 18. Referring to the figure, numeral 1 designates a light source, numeral 11 a circulator, numeral 12 a polarizing separation element of calcite or the like, numeral 13 a ferromagnetic Faraday rotor which consists of a permanent magnet (13a) and a ferromagnetic crystal (13b) of YIG or the like, numeral 14 a mirror, numeral 15 an electric conductor through which a current to-be-measured flows, numeral 16 a sensor fiber, signs 21A and 21B light receiving elements (PD's), signs 22A and 22B amplifiers (A's), signs 23A and 23B band-pass filters (BPF's), signs 24A and 24B low-pass filters (LPF's), signs 25A and 25B dividers for calculating the ratios between the AC components and DC components of electric signals, numeral 26 a polarity inverter, and numeral 27 a multiplier. Incidentally, numeral 10 designates an optical system, numeral 20 designates a signal processing circuit, and the circulator 11 can be replaced with a semitransparent mirror or an optical fiber coupler. As the sensor fiber 16, a lead glass fiber is employed here, but a silica glass fiber can also be employed.

A polarized state in and around the polarizing separation element in FIG. 18 is as shown in FIG. 19. Here, an x-direction shall indicate a direction perpendicular to the sheet of the drawing, and a y-direction a direction parallel to the sheet of the drawing.

As shown in FIG. 19, in light guided from the light source 1 and entering the polarizing separation element 12, a component $E_1(\bullet)$ (a vector quantity is indicated by assigning a dot) which oscillates in the x-direction passes through the polarizing separation element 12, and it thereafter enters the sensor fiber 16. Next, $E_2(\bullet)$ is let denote the polarized wave of light which is reflected from the mirror 14, which passes through the sensor fiber 16 and the ferromagnetic Faraday rotor 13 again and which returns to the polarizing separation element 12.

The polarized wave is rotated when it passes through the ferromagnetic Faraday rotor (13) and the sensor fiber (16), so that both an x-directional component and a y-directional component arise as shown in FIG. 20 in the component $E_2(\bullet)$, and it is understood that the polarization components $E_A$ and $E_B$ which are separated into two are expressed as the following formulas:

$$E_A = E_M \cos(2\theta_G + 2\theta_i)\cos \omega_1 t$$

$$E_B = E_M \sin(2\theta_G + 2\theta_i)\cos \omega_1 t$$

Here, $E_M$: amplitude (V/m) of the return light $E_2(\bullet)$,
$\omega_1$: angular frequency (rad/sec) of the light wave,
$\theta_G$: Faraday rotation angle (rad) which the light passing through the ferromagnetic Faraday rotor once undergoes, and accordingly, the rotation angle becomes $2\theta_G$ in the case where the light reciprocates,
$\theta_i$: rotation angle (Faraday rotation angle) (rad) of the polarized wave based on a Faraday effect which the light undergoes when passing through the sensor fiber once, and accordingly, the rotation angle becomes $2\theta_i$ in the case where the light reciprocates.

Here, the intensity of the light is proportional to the temporal mean value of the square of the instantaneous value of the oscillation of the polarized wave, and hence, the intensities $I_A$ and $I_B$ of the respective polarized waves $E_A$ and $E_B$ become as indicated by formulas given below. Incidentally, mean values are indicated by assigning (–) to signs.

$$I_A = k_1 \{E_M^2 \cos^2(2\theta_G + 2\theta_i)\cos^2 \omega_1 t\}(-)$$

$$= (1/4)k_1 E_M^2 \{1 + \cos 4(\theta_G + \theta_i)\}$$

Likewise, $$I_B = k_1 \{E_M^2 \sin^2(2\theta_G + 2\theta_i)\cos^2 \omega_1 t\}(-)$$

$$= (1/4)k_1 E_M^2 \{1 - \cos 4(\theta_G + \theta_i)\}$$

Here, $\{*\}(-)$: temporal mean
$I_A$: intensity (W/m²) of the component A passing through the polarizing separation element,
$I_B$: intensity (W/m²) of the component B passing through the polarizing separation element,
$k_1$: coefficient.

The respective lights indicated by the above intensities $I_A$ and $I_B$ are guided to the light receiving elements $PD_A$ and $PD_B$ by the circulator (11) and the polarizing separation element (12) in FIG. 18, and currents or voltages which are proportional to the intensities $I_A$ and $I_B$ of the received lights are outputted as signals from the light receiving elements. These electric signals pass through the amplifiers 22A and 22B, and thereafter become electric signals $P_A$ and $P_B$ shown in FIG. 18. These are expressed as the following formulas:

$$P_A = A \cdot \cos^2(2\theta_G + 2\theta_i) \quad (1a)$$
$$= A[1 + \cos\{4(\theta_g + \theta_i)\}]$$

$$P_B = B[1 - \cos\{4(\theta_G + \theta_i)\}] \quad (1b)$$

Here, both "A" and "B" are coefficients which are proportional to mean received light quantities, and they change with the power of the light source, the fluctuations of the attenuations of the lights in optical paths which extend from the light source to the light receiving elements (21's), and so forth. "$\theta_G$" and "$\theta_i$" are the rotation angles (Faraday rotation angles) of the polarization planes as stated above.

Besides, since the current to-be-measured is the AC current, $$\theta_i = V\,i \tag{2a}$$

$$i = I_0 \cos\omega t \tag{2b}$$

$$\theta_i = V\,I_0 \cos\omega t \tag{2c}$$

hold. Here,
V: Verdet constant (rad/A) of the sensor fiber,
i: current to-be-measured (A),
$I_0$: amplitude (A) of the current to-be-measured,
$\omega$: angular frequency (rad/sec) of the current to-be-measured.

Now, it will be considered that the Verdet constant V of the sensor fiber and the Faraday rotation angle $\theta_G$ depend upon temperatures.

More specifically, $$V = (1+\alpha T)V_s \tag{3}$$

$$\theta_G = (1+\beta T)F_s d \tag{4}$$

are assumed. Here,
$V_s$: Verdet constant (rad/A) of the sensor fiber at a reference temperature,
$\alpha$: temperature-dependence coefficient (1/° C.) of the Verdet constant of the sensor fiber (for example, the coefficient $\alpha$ of the lead glass fiber is on the order of 0.01%/K, the coefficient $\alpha$ of the silica glass fiber is on the order of 0.0069%/K),
T: difference (° C.) between the ambient temperature of the sensor and the reference temperature,
$F_s$: Faraday rotatability (rad/m) of the ferromagnetic Faraday rotor at the reference temperature,
d: thickness of the ferromagnetic Faraday rotor (m),
$\beta$: temperature-dependence coefficient (1/° C.) of the Faraday rotatability of the ferromagnetic Faraday rotor.

Besides, in order to ensure the linearity of the input/output characteristic of the sensor, an optical bias is obtained as indicated by the following formula:

$$F_s d = \pi/8 \tag{5a}$$

Incidentally, $$\theta_{Gs} = F_s d \tag{5b}$$

holds. Here,
$\theta_{Gs}$: Faraday rotation angle (rad) which the light passing through the ferromagnetic Faraday rotor undergoes at the reference temperature.

When Formulas (2), (3), (4) and (5) are substituted into the foregoing formulas (1), the formulas of the electric signals $P_A$ and $P_B$ in which the temperature dependences of the constituent components are considered are obtained:

$$P_A = A[1 + \cos\{4(1+\beta T)F_s d + (1+\alpha T)V_s I_0 \cos\omega t\}] \tag{6a}$$
$$= A[1 + \cos\{\pi/2 + 4\beta f_s dT + 4(1+\alpha T)V_s I_0 \cos\omega t\}]$$

$$P_B = B[1 - \cos\{\pi/2 + 4\beta f_s dT + 4(1+\alpha T)V_s I_0 \cos\omega t\}] \tag{6b}$$

Here, the following is assumed as conditions which actually hold:

$$|4\beta F_s d\,T| \ll \pi/2 \tag{7a}$$

$$|4(1+\alpha T)V_s I_0| \ll \pi/2 \tag{7b}$$

When Formulas (7a) and (7b) are substituted into Formulas (6), Formulas (6) become the following formulas:

$$P_A = A\{1 - \sin 4(\beta F_s dT) + 4(1+\alpha T)V_s I_0 \cos\omega t\} \tag{8a}$$
$$= A\{(1 - 4\beta F_s dT) - 4(1+\alpha T)V_s I_0 \cos\omega t\}$$

$$P_B = B\{(1 + 4\beta F_s dT) + 4(1+\alpha T)V_s I_0 \cos\omega t\} \tag{8b}$$

The first terms of Formulas (8a) and (8b) are the DC components of the signals. Besides, the second terms are the AC components. These fluctuate with temperatures. Accordingly, modulation signals $S_A$ and $S_B$ in FIG. 18 are the ratios between the DC components and AC components of the electric signals $P_A$ and $P_B$ and indicate modulation degrees. These signals can be expressed as the following formulas, considering the fact that the AC components and DC components of the electric signals are separated by the BPF's and LPF's, the fact that the signal $S_A$ has had its polarity inverted, and the condition of Formula (7a):

$$S_A = (-1)[P_A]_{AC}/[P_A]_{DC} \tag{9a}$$
$$= -1 \times \{-4(1+\alpha T)V_s I_0 \cos\omega t\}/(1 - 4\beta F_s dT)$$
$$= (1+\alpha T) \cdot 4V_s I_0 \cos\omega t/(1 - 4\beta F_s dT)$$

$$S_B = [P_B]_{AC}/[P_B]_{DC} \tag{9b}$$
$$= (1+\alpha T) \cdot 4V_s I_0 \cos\omega t/(1 + 4\beta F_s dT)$$

Further, from Formulas (9), a final output $S_{out}$ in FIG. 18 becomes:

$$S_{out} = (S_A + S_B)/2 \tag{10}$$
$$= (1/2)\{1/(1 - 4\beta F_s dT) + 1/(1 + 4\beta F_s dT \times$$
$$= 4(1+\alpha T)V_s I_0 \cos\omega t$$
$$= (1+\alpha T) \cdot 4V_s I_0 \cos\omega t/\{(1 - 4\beta F_s dT) \cdot$$
$$= (1 + 4\beta F_s dT)\}$$
$$= (1+\alpha T) \cdot 4V_s I_0 \cos\omega t/\{1 - (4\beta F_s dT)^2\}$$

When the quadratic term of the denominator of Formula (10) is omitted in consideration of the condition of the above formula (7a), the output $S_{out}$ is roughly expressed by the following formula:

$$S_{out} \approx (1+\alpha T) \bullet 4V_s I_0 \cos\omega t \tag{11}$$

The current measurement device which measures such a current to-be-measured i indicated in the current measurement device shown in FIG. 18 has the following advantages:
1) The device is not influenced by the fluctuations of the mean received light quantities.

As understood from Formulas (9a) and (9b), those coefficients A and B of Formulas (6a) and (6b) which are measurement errors arising from the vibrations of the light source, etc. are eliminated by calculating the modulation signals $S_A$ and $S_B$.

2) The device is not influenced by a photoelasticity.

Although no description has been made in terms of formulas, the lead glass fiber is employed for the sensor fiber, whereby the device does not undergo output fluctuations ascribable to the stress of the sensor fiber.

3) The device is not influenced by the deformation of a curve which the sensor fiber forms.

Although no description has been made in terms of formulas, the device is configured as the reflection type, whereby the polarized wave of the emergent light from the fiber does not depend upon a curve shape.

4) The device can suppress the temperature fluctuations of the optical bias.

As understood from Formulas (9)-(11), the influence which is exerted on the output $S_{out}$ by the temperature dependence of the Faraday rotatability of the ferromagnetic Faraday rotor can be relieved by calculating the mean of the two modulation signals $S_A$ and $S_B$.

The merits 1)-3) are expressed in other words, as follows:

1) The device is stable against the fluctuations of the light emission quantity of the light source and the connection efficiency of the optical system.
2) and 3) A frame for fixing the sensor fiber is dispensed with, and the whole sensor becomes small-sized and flexible. Besides, the sensor can be attached without opening the conductor through which the current to-be-measured flows.

Incidentally, the advantages etc. of the current measurement device shown in FIG. 18 are detailed in, for example, Document 1 and Patent Document 1.

Document 1: Kurosawa, Hiroki and Shirakawa, "Small-sized and Flexible Optical fiber current sensor", Collection of Papers of Lectures in the 30th Meeting of the Society for the Research of Light Wave Sensing Technology, P. 133-140, No. LST30-19, December 2002

Patent Document 1: JP-A-10-319051

DISCLOSURE OF THE INVENTION

Problems that the Invention is to Solve

In the reflection type lead glass fiber sensor which can realize the merits 1), 2) and 3), it is excellent in practical use for reasons such as the reduction of a size that the ferromagnetic Faraday rotor which is magnetically saturated by the permanent magnet is employed as the means of the optical bias required for ensuring the linearity of the sensor input/output. However, a temperature characteristic is involved in the ferromagnetic Faraday rotor which is commercially available. Accordingly, in the case of employing the ferromagnetic Faraday rotor, compensation for (reduction in) the temperature characteristic of this element is necessitated.

In the prior-art scheme shown in FIG. 18, the signal processing as indicated in Formulas (6)-(11) is executed for the purpose of the compensation for the temperature characteristic. In addition, as indicated in Formulas (6)-(11), it is permitted to compensate for the temperature characteristic, by the processing. It cannot be denied, however, that the configuration therefore becomes complicated. That is, as the first problem of the prior art:

Problem 1: In order to suppress the temperature fluctuations of the optical bias attributed to the temperature characteristic of the ferromagnetic Faraday rotor, the signal processing circuit and the receiving optical system are duplexed, so that the configuration is complicated.

Besides, as understood from Formula (11), even when the mean processing of the modulation degrees is executed, it is impossible to compensate for the temperature dependence of the sensor output attributed to the temperature dependence of the Verdet constant of the sensor fiber.

FIG. 21(*a*) shows the relationships between the error percentages and temperatures of the modulation signals $S_A$ and $S_B$ in the case of FIG. 18, while FIG. 21(*b*) shows the temperature characteristic of the sensor fiber. That is, even when the mean processing of the modulation signals $S_A$ and $S_B$ as shown in FIG. 21(*a*) is executed, Problem 2 as shown in FIG. 21(*b*) arises:

Problem 2: It is impossible to compensate for the temperature dependence of the sensor output attributed to the temperature dependence of the Verdet constant of the sensor fiber. Incidentally, it is known from Document 2 and also from FIG. 21(*b*) that, in the case of the lead glass fiber, the temperature dependence α is on the order of 0.01%/° C.(=1%/100° C.)

Document 2: K. Kurosawa, "Optical Current Transducers Using Flint Glass Fiber as the Faraday Sensor Element", Optical Review Vol. 4, No. 1A, pp. 38-44, 1997

Besides, the temperature dependence of the sensor output attributed to the temperature dependence of the Verdet constant of the sensor fiber arises similarly even in a case where the temperature characteristic of the ferromagnetic Faraday rotor is nullified instead of the execution of the mean processing of the modulation degrees.

Accordingly, an object of this invention is to simultaneously solve Problems 1 and 2 mentioned above.

Means for Solving the Problems

In order to solve such problems, the invention of claim 1 consists in a photocurrent sensor wherein a Faraday effect induced by an AC current to-be-measured is derived as an intensity modulation signal of light;

characterized in that, as a ferromagnetic Faraday rotor which is inserted into an optical path between a polarizer and an analyzer, one with which a modulation degree indicated by a ratio between an AC component and a DC component becomes constant versus a temperature change when the intensity modulation signal of the light is converted into an electric signal is selected, thereby to reduce a temperature dependence of a sensor output attributed to a temperature dependence of a Verdet constant of the photocurrent sensor.

The invention of claim 2 consists in a photocurrent sensor wherein a Faraday effect induced by an AC current to-be-measured is derived as an intensity modulation signal of light;

characterized in that, as a ferromagnetic Faraday rotor which is inserted into an optical path between a polarizer and an analyzer, one with which a Faraday rotation angle becomes equal to or smaller than a temperature-dependent change rate of an AC component of an electric signal and a temperature-dependent change rate of a DC component of the electric signal when the intensity modulation signal of the light is converted into the electric signal is selected, thereby to reduce a temperature dependence of a sensor output attributed to a temperature dependence of a Verdet constant of the photocurrent sensor.

The invention of claim 3 consists in a photocurrent sensor wherein a Faraday effect which light passing through a sensor element undergoes when a rectilinear polarization is generated using a polarizer from light emitted from a light source, the rectilinear polarization is passed through the sensor element made of a transparent medium, and a magnetic field induced by an AC current to-be-measured is applied to the sensor element is derived as a signal of light (intensity modulation light) subjected to an intensity modulation by an analyzer; the intensity modulation light is converted into an electric signal; and a modulation degree which is indicated by a ratio between an AC component and a DC component of the electric signal is obtained as an output of the sensor;

characterized in that a ferromagnetic Faraday rotor which is magnetically saturated is inserted into an optical path which extends from the polarizer to the analyzer via the sensor element, and that, as a temperature-dependent value of a Faraday rotation angle which arises in the ferromagnetic Faraday rotor, one with which the modulation degree becomes constant versus a temperature change is selected, thereby to reduce a temperature dependence of the sensor output attributed to a temperature dependence of a Verdet constant of the sensor element.

In the above invention of claim 3, as the temperature-dependent value of the Faraday rotation angle which arises in the ferromagnetic Faraday rotor, one with which an absolute value of a temperature dependence of the modulation degree becomes smaller than an absolute value of a temperature-dependent of the Verdet constant of the sensor element can be selected, thereby to reduce an absolute value of the temperature-dependent error of the sensor output attributed to the temperature dependence of the Verdet constant of the sensor element (the invention of claim 4). The invention of claim 3 or claim 4 can be so configured that the light emitted from the light source and passed through the polarizer is reflected by a mirror after being passed through the ferromagnetic Faraday rotor and the sensor element, thereby to be returned to the polarizer which serves also as the analyzer, and that the reflected light is passed through the polarizer which serves also as the analyzer, thereby to be derived as the signal of the light subjected to the intensity modulation (the invention of claim 5).

In the invention of claim 3 or claim 4, the temperature-dependent value of the Faraday rotation angle which arises in the ferromagnetic Faraday rotor can meet relations of the following formula (I) (the invention of claim 6):

$$-\alpha \leq \alpha \pm 2\beta F_s d \leq \alpha \qquad (I)$$

where $\alpha$ indicates a temperature-dependence coefficient of a Verdet constant of a sensor fiber, $\beta$ indicates a temperature-dependence coefficient of a Faraday rotatability of the ferromagnetic Faraday rotor, $F_s$ indicates the Faraday rotatability of the ferromagnetic Faraday rotor at a reference temperature, and d indicates a thickness of the ferromagnetic Faraday rotor.

In the invention of any of claims 3 through 5, the temperature-dependent value of the Faraday rotation angle which arises in the ferromagnetic Faraday rotor can meet relations of the following formula (II) (the invention of claim 7):

$$-\alpha \leq \alpha \pm 4\beta F_s d \leq \alpha \qquad (II)$$

where $\alpha$ indicates a temperature-dependence coefficient of a Verdet constant of a sensor fiber, $\beta$ indicates a temperature-dependence coefficient of a Faraday rotatability of the ferromagnetic Faraday rotor, $F_s$ indicates the Faraday rotatability of the ferromagnetic Faraday rotor at a reference temperature, and d indicates a thickness of the ferromagnetic Faraday rotor.

Besides, in the invention of any of claims 1 through 7, the Faraday rotation angle based on the ferromagnetic Faraday rotor and the temperature-dependent value thereof can be adjusted by combining a plurality of Faraday rotors whose Faraday rotatabilities and temperature-dependence characteristics are different, and changing thicknesses of the respective rotors (the invention of claim 8).

The invention of claim 9 is characterized by comprising conversion means for deriving a Faraday effect induced by an AC current to-be-measured, as an intensity modulation signal of light, and for converting the intensity modulation signal of the light into an electric signal, arithmetic means for extracting an AC component and a DC component of the electric signal and for calculating a modulation degree which is indicated by a ratio between the components, and adjustment means for adjusting a temperature-dependent change rate of the AC component and a temperature-dependent change rate of the DC component so as to become equal or smaller.

The invention of claim 10 consists in a photocurrent sensor device wherein a Faraday effect induced by an AC current to-be-measured is derived as an intensity modulation signal of light, characterized by comprising:

a ferromagnetic Faraday rotor which is inserted into an optical path between a polarizer and an analyzer, conversion means for converting an optical signal from the analyzer, into an electric signal, and arithmetic means for extracting an AC component and a DC component of the electric signal and for calculating a modulation degree which is indicated by a ratio between the components, wherein a temperature-dependent value of a Faraday rotation angle which arises in the ferromagnetic Faraday rotor meets relations of the following formula (I):

$$-\alpha \leq \alpha \pm 2\beta F_s d \leq \alpha \qquad (I)$$

where $\alpha$ indicates a temperature-dependence coefficient of a Verdet constant of a sensor fiber, $\beta$ indicates a temperature-dependence coefficient of a Faraday rotatability of the ferromagnetic Faraday rotor, $F_s$ indicates the Faraday rotatability of the ferromagnetic Faraday rotor at a reference temperature, and d indicates a thickness of the ferromagnetic Faraday rotor.

The invention of claim 11 consists in a photocurrent sensor device wherein a Faraday effect induced by an AC current to-be-measured is derived as an intensity modulation signal of light, characterized by comprising:

a polarizer which serves also as an analyzer, a sensor element which has a mirror mounted at one end thereof, a ferromagnetic Faraday rotor which is inserted into an optical path between the polarizer and the sensor element, conversion means for converting an optical signal from the analyzer, into an electric signal, and arithmetic means for extracting an AC component and a DC component of the electric signal and for calculating a modulation degree which is indicated by a ratio between the components, wherein a temperature-dependent value of a Faraday rotation angle which arises in the ferromagnetic Faraday rotor meets relations of the following formula (II):

$$-\alpha \leq \alpha \pm 4\beta F_s d \leq \alpha \qquad (II)$$

where $\alpha$ indicates a temperature-dependence coefficient of a Verdet constant of a sensor fiber, $\beta$ indicates a temperature-dependence coefficient of a Faraday rotatability of the ferromagnetic Faraday rotor, $F_s$ indicates the Faraday rotatability of the ferromagnetic Faraday rotor at a reference temperature, and d indicates a thickness of the ferromagnetic Faraday rotor.

In the invention of claim 10 or claim 11, the Faraday rotation angle based on the ferromagnetic Faraday rotor and the temperature-dependent value thereof are adjusted by combining a plurality of Faraday rotors whose Faraday rotatabilities and temperature-dependence characteristics are different, and changing thicknesses of the respective rotors (the invention of claim 12).

ADVANTAGES OF THE INVENTION

In case of an optical fiber current sensor of reflection type, the advantages of the following items (1) and (2) are attained, and in case of an optical fiber current sensor of transmission type, the advantage of the item (2) is attained:

(1) The mean processing of modulation degrees, which is employed in order to suppress the temperature fluctuation of an output attributed to the temperature dependence of the optical bias becomes unnecessary to be able to simplify the optical system/electronic circuit and the configuration thereof, in the conventional configuration.

(2) It is possible to compensate the temperature dependence of the output attributed to the temperature dependence of the Verdet constant of the sensor fiber.

BRIEF DESCRIPTION OF THE DRAWINGS

[FIG. 2] It is an explanatory diagram of the principle #1 of this invention.

[FIG. 7] It is a diagram for explaining those ranges of the parameters in which the scheme I becomes valid.

[FIG. 8] It is a configurational diagram showing the configuration of a transmission type sensor.

[FIG. 11] It is a diagram for explaining those ranges of the parameters in which the scheme II becomes valid.

[FIG. 12] It is a diagram for comparing and explaining Formulas $S_A$ and $S_B$ in the cases where optical biases are plus and minus in a reflection type.

[FIG. 13] It is a diagram for explaining the relationship among parameters and signals to-be-selected in the case of a scheme III.

[FIG. 14] It is a diagram for explaining those ranges of the parameters in which the scheme III becomes valid.

[FIG. 15] It is a diagram for comparing and explaining Formulas $S_A$ and $S_B$ in the cases where optical biases are plus and minus in a transmission type.

[FIG. 16] It is a diagram for explaining the relationship among parameters and signals to-be-selected in the case of a scheme IV.

[FIG. 17] It is a diagram for explaining those ranges of the parameters in which the scheme IV becomes valid.

[FIG. 21] It is a diagram for explaining the relationships between the error percentages of modulation degrees and temperatures and the temperature characteristic of a sensor fiber, in the case of FIG. 18.

DESCRIPTION OF REFERENCE NUMERALS AND SIGNS

Figure 1:
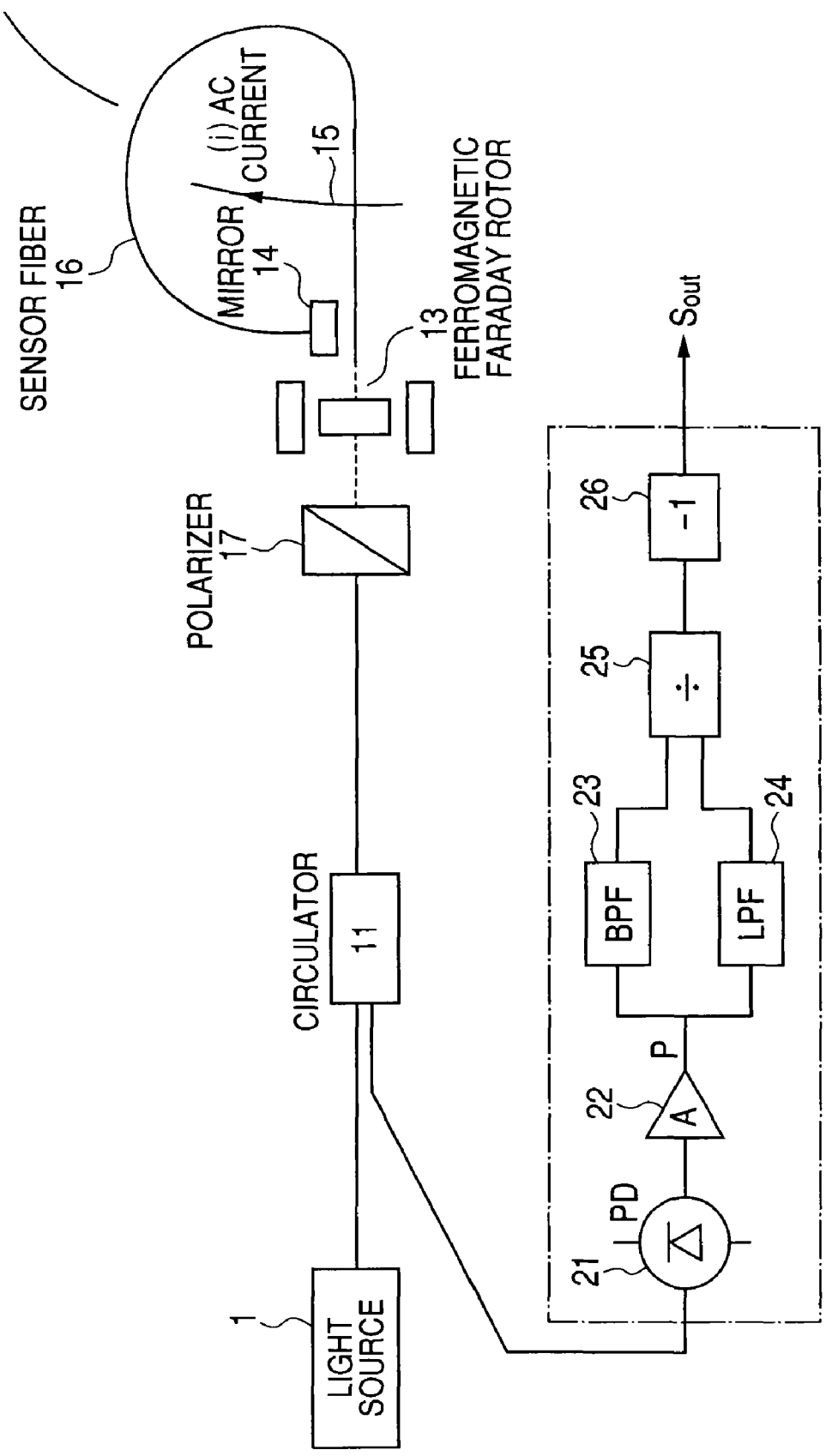
[FIG. 1] It is a configurational diagram showing the first embodiment of this invention.

1 ... light source, 10 ... optical system, 11 ... circulator, 12 ... polarizing separation element, 13 ... ferromagnetic Faraday rotor, 13a ... permanent magnet, 13b ... ferromagnetic substance crystal, 14 ... mirror, 15 ... electric conductor, 16 ... sensor fiber (lead glass fiber), 17 ... polarizer, 18 ... analyzer, 20 ... signal processing circuit, 21A, 21B ... light receiving elements, 22A, 22B ... amplifiers, 23A, 23B ... band-pass filters, 24A, 24B ... low-pass filters, 25A, 25B ... dividers, 26 ... polarity inverter, 27 ... multiplier.

BEST MODE FOR CARRYING OUT THE INVENTION

Before describing the embodiments of this invention, the principles of this invention will be first described.

Reference will be had to FIG. 2.

It is assumed that a temperature has lowered from a certain point. Then, a Verdet constant V becomes smaller.

That is, a polarization-plane rotation angle (Faraday rotation angle) becomes smaller for an identical current i to-be-measured, so that the relationship between the current i to-be-measured and an output signal P changes from I into II in FIG. 2(a). Then, the electric signal P which is outputted changes from III into IV in FIG. 2(b). That is, the amplitude of the electric signal P which is outputted becomes smaller for the identical current i to-be-measured.

Finally, as a measurement value, the electric signal P is evaluated by the signal S of the ratio (modulation degree) between its DC component $[P]_{DC}$ and its AC component $[P]_{AC}$ in order to eliminate the influence of a light source. Here, if the value of the DC component $[P]_{DC}$ fluctuates k times with a proportion $k(=[P_I]_{AC}/[P_{II}]_{AC})$ in which the AC component $[P]_{AC}$ fluctuates, apparently the modulation signal S does not undergo a fluctuation ascribable to the temperature. Besides, if a proportion j in which the DC component $[P]_{DC}$ fluctuates has a value which is larger than zero and which is smaller than the fluctuating proportion k times of the AC component $[P]_{AC}$, the error which depends upon the temperature can be decreased more than in the case where no countermeasure is taken (j=0).

While the case where the temperature lowers has been described above, a case where the temperature changes above the certain point will be described below.

In this case, the Verdet constant V enlarges, and hence, the polarization-plane rotation angle (Faraday rotation angle) enlarges for the identical current i to-be-measured. Then, the amplitude of the electric signal P which is outputted for the identical current i to-be-measured becomes larger.

Here, if the value of the DC component $[P]_{DC}$ fluctuates k times with the proportion k in which the AC component $[P]_{AC}$ fluctuates, apparently the modulation signal S which is finally used does not undergo the fluctuation ascribable to the temperature. Besides, if the proportion j in which the DC component $[P]_{DC}$ fluctuates has the value which is larger than zero and which is smaller than the fluctuating proportion k times of the AC component $[P]_{AC}$, the error which depends upon the temperature can be decreased more than in the case where no countermeasure is taken (j=0).

That is, in both the cases where the temperature changes to be higher and where it changes to be lower, the fluctuating proportion k of the AC component $[P]_{AC}$ of the electric signal P and the fluctuating proportion j of the DC component $[P]_{DC}$ as are ascribable to the temperature dependence are made equal or smaller, whereby that temperature error of the whole device which occurs in dependence on the temperature can be decreased. This is the basic concept of this invention.

Here, the Verdet constant and the temperature-dependent characteristic thereof are obtained by themselves when the configuration of a measurement instrument is known.

Besides, a method for changing the fluctuating proportion j of the DC component $[P]_{DC}$ may well be realized by incorporating an arithmetic unit which multiplies the value of the DC component $[P]_{DC}$ by j in accordance with the temperature. Since the temperature-dependent characteristic which is brought about by all the constituents (a sensor fiber, a Faraday rotor, etc.) of the measurement instrument is known beforehand, the method is realizable in such a way that, while an ambient temperature is being measured by a temperature sensor, the DC component $[P]_{DC}$ is multiplied by the value based on data prepared beforehand, by means of the multiplier unit (not illustrated)

Alternatively, it is realizable to decrease the temperature-dependent error, by fluctuating an optical bias. The Verdet constant of the sensor fiber and the temperature-dependent characteristic thereof can be obtained by themselves when the configuration of the measurement instrument is known. When the optical bias is enlarged, the electric signal P changes from II into V. That is, the DC component $[P]_{DC}$ changes from $[P_{II}]_{DC}$ into $[P_V]_{DC}$ in FIG. 2(c). If a fluctuating proportion J' ($[P_{II}]_{DC}/[P_V]_{DC}$) here is smaller than the fluctuating proportion k times of the AC component $[P]_{AC}$, the error of the whole measurement device as occurs in dependence on the temperature can be decreased.

Here, the fluctuation of the optical bias can be adjusted by the thickness, the material, etc. of a ferromagnetic substance crystal (13b) of which the ferromagnetic Faraday rotor is made.

As compared with the realizing method based on the multiplier unit, the method in which the value of the DC component $[P]_{DC}$ is multiplied by means of the ferromagnetic Faraday rotor is superior in the point that any separate arithmetic device or temperature sensor is not required, and the point that the measurement error occurring due to the temperature can be decreased by physical characteristics themselves inherent in the individual constituents.

Further, the principle of this invention in the case where this invention is realized by fluctuating the optical bias will be concretely described.

If the values of the terms of a denominator and a numerator as relate to the temperature T can be equalized in Formula (9a) mentioned before, it is considered that the temperature dependence of $S_A$ can be nullified. That is, the following holds:

$$1+\alpha T=1-4\beta F_s d\,T$$

$$\alpha=-4\beta F_s d \tag{12}$$

Figure 3:
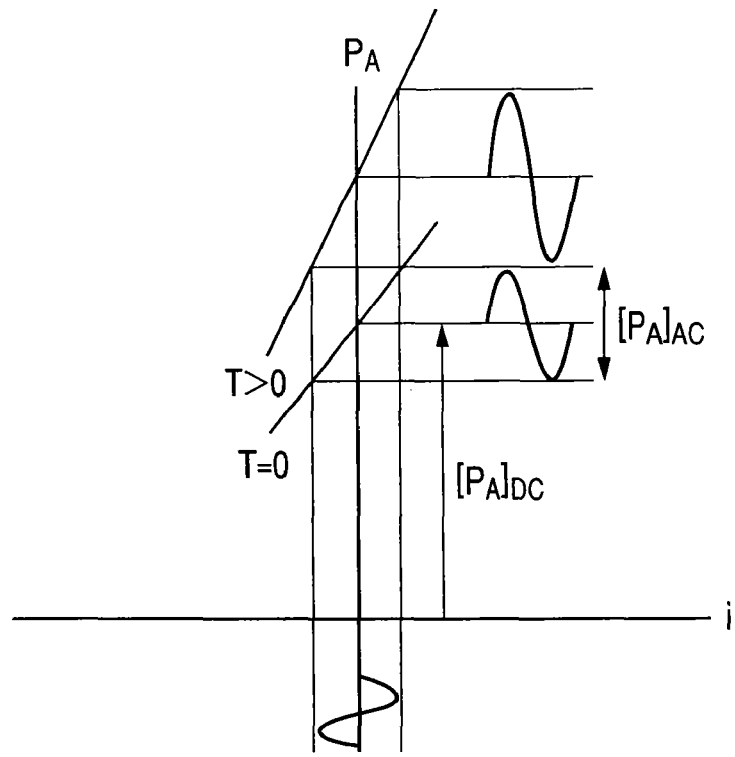
[FIG. 3] It is an explanatory diagram of the principle #2 of this invention.

It is FIG. 3 that elucidates this fact, and the figure conceptually illustrates to equalize the ratio between $[P_A]_{AC}$ and $[P_A]_{DC}$.

Since Formula (9a) holds under the conditions of Formulas (5), the condition will be written here again:

$$F_s d=\pi/8 \tag{5a}$$

When Formula (5a) is substituted into Formula (12), $$\alpha=-\pi\beta/2$$

That is, the temperature-dependence coefficient β of the Faraday rotatability of the ferromagnetic Faraday rotor becomes:

$$\beta=-2\alpha/\pi \tag{13}$$

Incidentally, as a method for adjusting β, one stated in the following document 3 has been known:

Document 3: Kawakami, Shiraishi and Oohashi, "Optical fiber and Optical fiber type device", P. 275-283, 1996. 7, First Edition, Baifukan When Formulas (12) and (5a) are substituted into Formula (9a), the following formula is obtained:

$$S_A=4V_s I_0 \cos\omega t \tag{14}$$

From the above, the following fact can be said:

When the ferromagnetic Faraday rotor in which Formula (13) holds is employed, the setting of the optical bias expressed by Formula (5a) and compensations for both the temperature dependence β of the Faraday rotatability of the ferromagnetic Faraday rotor and the temperature dependence α of the Verdet constant of the sensor fiber as are expressed by Formula (12) are realized, adjusting of thickness of the ferromagnetic Faraday rotor.

When this condition is set, the following two are permitted:
(1) The mean processing of the modulation degrees as in the prior-art example, intended to compensate for the optical bias fluctuation ascribable to the temperature dependence of the ferromagnetic Faraday rotor is dispensed with.
(2) Besides, the temperature dependence of the output attributed to the temperature dependence of the Verdet constant of the sensor fiber can be nullified.

Accordingly, the two problems stated as Problems 1 and 2 mentioned before can be solved by applying the idea as described above. This signifies that a higher precision can be achieved by a configuration simpler than in FIG. 18.

While the conditions for eliminating the temperature dependence of the modulation signal $S_A$ have been stated in the above, they are applicable also to the modulation signal $S_B$ on the basis of a similar idea.

The conditions in this case become as follows, unlike those in the case of $S_A$:

The condition for nullifying the temperature characteristic of Formula (9b) is as given by the following formula:

$$1+\alpha T=1+4\beta F_s d\,T$$

Accordingly, $$\alpha=4\beta F_s d\,T \tag{15}$$

Also, Formula (5a) is similarly required.

$$F_s d=\pi/8 \tag{5a}$$

When Formula (5a) is substituted into Formula (15), $$\beta=2\alpha/\pi \tag{16}$$

When Formula (16) is compared with Formula (13), it is understood that the sign of β is opposite.

In Formula (5a), $$F_s d=\pi/8 \tag{5a}$$

holds, and $F_s>0$ (because d>0).

On the other hand, in case of employing the ferromagnetic Faraday rotor which affords $F_s<0$, the following is set:

$$F_s d=-\pi/8 \tag{17}$$

Thus, when Formulas (6), et seq. are reduced in consideration of signs, studies can be made similarly to the above.

Although the elucidation has become somewhat lengthy, the above is the principle of this invention. Besides, although the denominator and the numerator have been made equal without regard to the temperature, in the above, the ratio between them may well be made a constant value instead.

FIG. 1 is a configurational diagram showing that embodiment of this invention which is based on the principle as stated above.

As apparent from the figure, the embodiment features the simplified point that the polarizing separation element of an optical system which is configured of a light source 1, a circulator 11, a ferromagnetic Faraday rotor 13, a mirror 14, a sensor fiber 16, etc. is altered to a polarizer 17, and that a signal processing circuit is made a configuration of single loop as consists of a light receiving element 21, an amplifier 22, a BPF 23, an LPF 24, a divider 25 and a polarity inverter 26. The other functions, operations, etc. are the same as in the case of FIG. 18. Accordingly, the details of them shall be omitted.

Next, a method for combining two ferromagnetic Faraday rotors will be described.

As a Faraday rotor for the optical isolator of optical fiber communications, in which the two ferromagnetic Faraday rotors opposite in the sign of the temperature dependence of a Faraday rotatability are combined, thereby to make the temperature dependence of a Faraday rotation angle a value close to zero, a product commercially available is known from, for example, Document 4.

Document 4:

"Zero Temperature Dependence Faraday Rotator (R-type series)" Technical manual No. GO4-03, Mitsubishi Gas Chemical Company Inc. Info-Advanced Materials Division, Photocrystal Inc., Tokyo Plant Also, a similar technique is introduced on P. 275 in Document 3 mentioned before.

In this manner, the temperature dependence of the Faraday rotation angle can be adjusted by combining the two ferromagnetic Faraday rotors.

A method for reducing (compensating for) both the temperature dependences of the Faraday rotatabilities of the ferromagnetic Faraday rotors and the temperature dependence of the Verdet constant of the sensor fiber by exploiting this knowledge will be described with reference to FIG. 4 below.

First, the significances of individual signs indicated in the figure are as follows:

$F_{1S}$: Faraday rotatability of the rotor #1 at a reference temperature (rad/m),
$F_{2S}$: Faraday rotatability of the rotor #2 at the reference temperature (rad/m),
$d_1$: thickness of the rotor #1 (m),
$d_2$: thickness of the rotor #2 (m),
$\beta_1$: temperature coefficient of the Faraday rotatability of the rotor #1 (1/° C.),
$\beta_2$: temperature coefficient of the Faraday rotatability of the rotor #2 (1/° C.).

Figure 4:
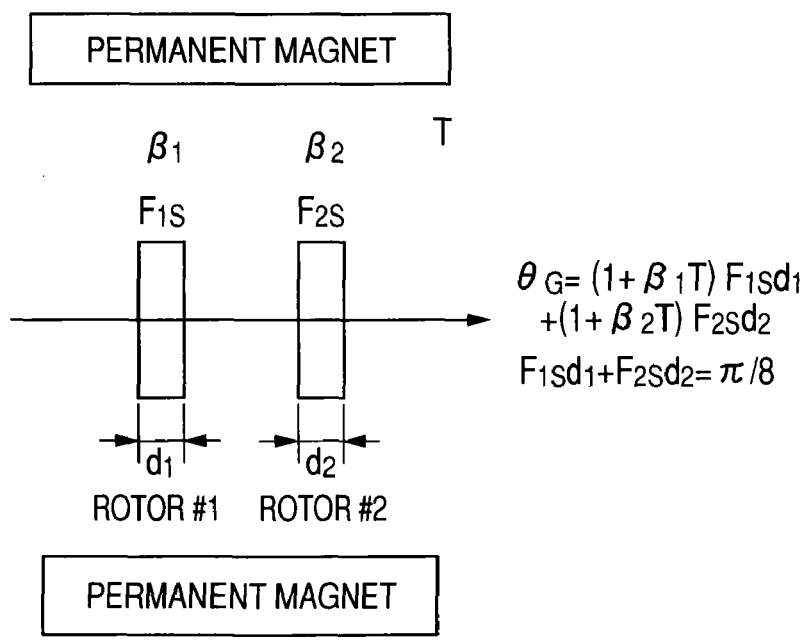
[FIG. 4] It is an explanatory diagram for explaining a method for combining two ferromagnetic Faraday rotors.

Now, the Faraday rotation angle of light which passes through the two rotors #1 and #2 in FIG. 4 once is expressed as the following formula:

$$\theta_G = (1+\beta_1 T)F_{1S}d_1 + (1+\beta_2 T)F_{2S}d_2 \tag{18}$$

Besides, since the total Faraday rotation angle at the reference temperature becomes $\pi/8$ in conformity with the foregoing formula (5a), the following formula is obtained from Formula (18)

$$F_{1S}d_1 + F_{2S}d_2 = \pi/8 \tag{19}$$

Besides, when Formula (9a) is referred to, the following formula is obtained as a condition in which the temperature characteristic of the output of the sensor becomes zero:

$$1+\alpha T = 1 - 4(\beta_1 F_{1S}d_1 T + \beta_2 F_{2S}d_2 T)$$

$$\alpha = -4(\beta_1 F_{1S}d_1 + \beta_2 F_{2S}d_2) \tag{20}$$

If $d_1$ and $d_2$ are calculated from Formulas (19) and (20), conditions in which the temperature dependence of the sensor output is made zero when $\alpha$ (the temperature coefficient of the sensor fiber), $F_{1S}$ and $F_{2S}$ (the Faraday rotatabilities of the two rotors), and $\beta_1$ and $\beta_2$ (the temperature coefficients of the Faraday rotatabilities of the two rotors) are given are obtained.

By the way, in this case, the foregoing formula (9a) is altered as given by the following formula:

$$S_A = (1+\alpha T) \bullet 4V_s I_0 \cos \omega t / \{1 - 4(\beta_1 F_{1S}d_1 + \beta_2 F_{2S}d_2)T\} \tag{21}$$

$d_1$ and $d_2$ are calculated as follows:
From (19), $$F_{2S}d_2 = \pi/8 - F_{1S}d_1 \tag{19'}$$

By substituting (19') into (20), the following holds:

$$\alpha = -4\{\beta_1 F_{1S}d_1 + \beta_2(\pi/8 - F_{1S}d_1)\}$$
$$= -\beta_2 \cdot \pi/2 - 4(\beta_1 - \beta_2)F_{1S}d_1$$

Therefore, the following holds:

$$d_1 = (\alpha + \pi\beta_2/2)/4(\beta_1 - \beta_2)F_{1S} \tag{22}$$

From (19), $$F_{1S}d_1 = \pi/8 - F_{2S}d_2 \tag{19''}$$

By substituting (19'') into (20), the following holds:

$$\alpha = -4\{\beta_1(\pi/8 - F_{2S}d_2) + \beta_2 F_{2S}d_2\}$$
$$= -\pi\beta_1/2 + 4(\beta_1 - \beta_2)F_{2S}d_2$$

Therefore, the following holds:

$$d_2 = (\alpha + \pi\beta_1/2)/(-4)(\beta_2 - \beta_1)F_{2S} \tag{23}$$

In Formulas (22) and (23), the following must hold:

$$d_1 \geqq 0 \tag{24a}$$

$$d_2 \geqq 0 \tag{24b}$$

Accordingly, the following conditions need to be met:

$$\beta_2 \neq \beta_1 \tag{25a}$$

$$F_{2S} \neq 0 \tag{25b}$$

$$F_{1S} \neq 0 \tag{25c}$$

Next, there will be elucidated a case where three or more rotors are combined.

The number of the ferromagnetic Faraday rotors is not restricted to two, but the scheme is realizable also with the three or more rotors. In the case of, for example, the three rotors, formulas which correspond to Formulas (19) and (20) become as follows:

$$F_{1S}d_1 + F_{2S}d_2 + F_{3S}d_3 = \pi/8 \tag{26}$$

$$\alpha = -4(\beta_1 F_{1S}d_1 + \beta_2 F_{2S}d_2 + \beta_3 F_{3S}d_3) \tag{27}$$

Conditions in this case are the two formulas (26) and (27), and unknown numbers are the three; $d_1$, $d_2$ and $d_3$. Accordingly, a plurality of sets exist as the sets ($d_1$, $d_2$ and $d_3$) of solutions satisfying the conditions.

Figures 5, 6:
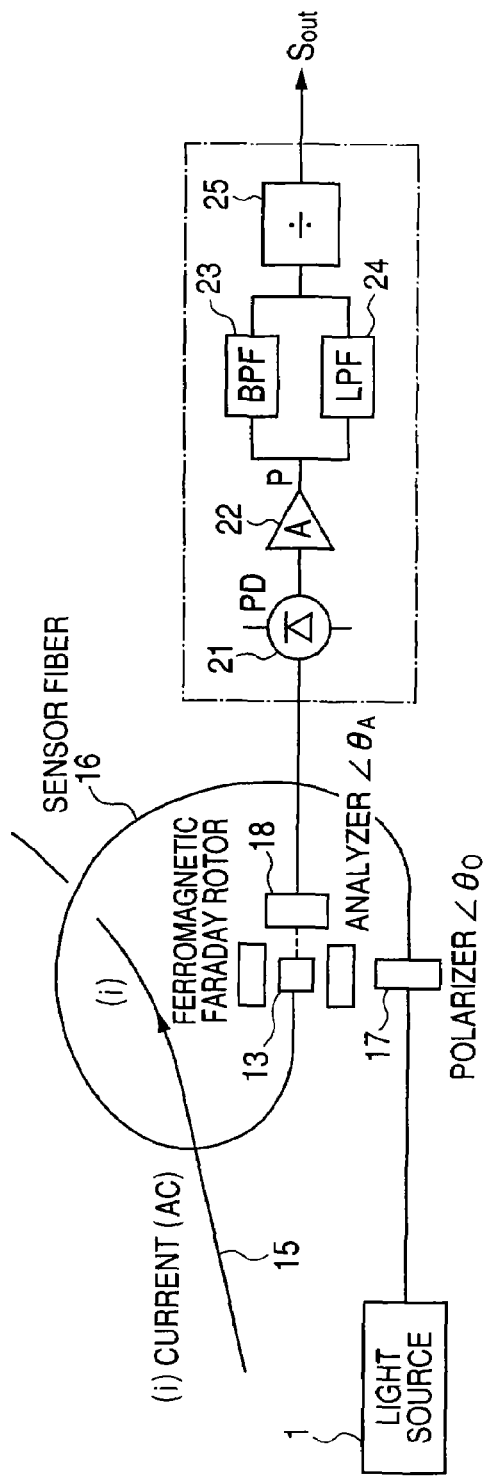
[FIG. 5] It is a configurational diagram showing the second embodiment of this invention.
[FIG. 6] It is a diagram for explaining the relationship among parameters and signals to-be-selected in the case of a scheme I.

An example in which the idea of the reflection type as stated above is applied to a device of transmission type is shown in FIG. 5.

Here, the device is the same as in FIG. 1 except that a ferromagnetic Faraday rotor 13 is inserted between a polarizer 17 and an analyzer 18 and that any mirror is not disposed, so the details of the device shall be omitted.

An optical bias in this case is attained by the azimuthal difference of the analyzer 18 relative to the polarizer 17, and the rotation of a polarized wave by the ferromagnetic Faraday rotor 13. More specifically, $$\theta_A + F_S d = \pi/4 \quad (28)$$

Here,
$\theta_A$=azimuth of the analyzer (rad),
$F_S$=Faraday rotatability of the ferromagnetic Faraday rotor (rad/m),
d=thickness of the ferromagnetic Faraday rotor (m).

Incidentally, although the case of using the single ferromagnetic Faraday rotor is supposed in Formula (28), a plurality of rotors can also be combined on the basis of the same consideration as in the above.

In the case of setting the optical bias expressed by Formula (28), an output $S_{out}$ is expressed by the following formula, on the basis of the same idea as in Formula (9a):

$$S_{out} = (1+\alpha T) 2V_s I_0 \cos \omega t/(1-2\beta F_S d\, T) \quad (29)$$

A condition in which this formula (29) is freed from any temperature characteristic is expressed by the following formula likewise to the foregoing formula (12):

$$\alpha = -2\beta F_S d \quad (30)$$

From Formula (30), the following holds:

$$d = -\alpha/(2\beta F_S) \quad (31)$$

When Formula (31) is substituted into Formula (28), $\theta_A$ is obtained:

$$\theta_A = \pi/4 + \alpha/(2\,\beta) \quad (32)$$

In the case of the conditions of Formulas (31) and (32), the output $S_{out}$ becomes as indicated by the following formula:

$$S_{out} = 2\,V_s\,I_0 \cos \omega t \quad (33)$$

In the above, as the ferromagnetic Faraday rotor (garnet), there has been selected one with which a modulation degree indicated by the ratio between the AC component and the DC component becomes constant versus a temperature change when the intensity modulation signal of the light is converted into the electric signal, but a ferromagnetic Faraday rotor with which the modulation degree comes to lie within a constant range versus the temperature change can also be selected. That case will be described in detail below.

Figure 18:
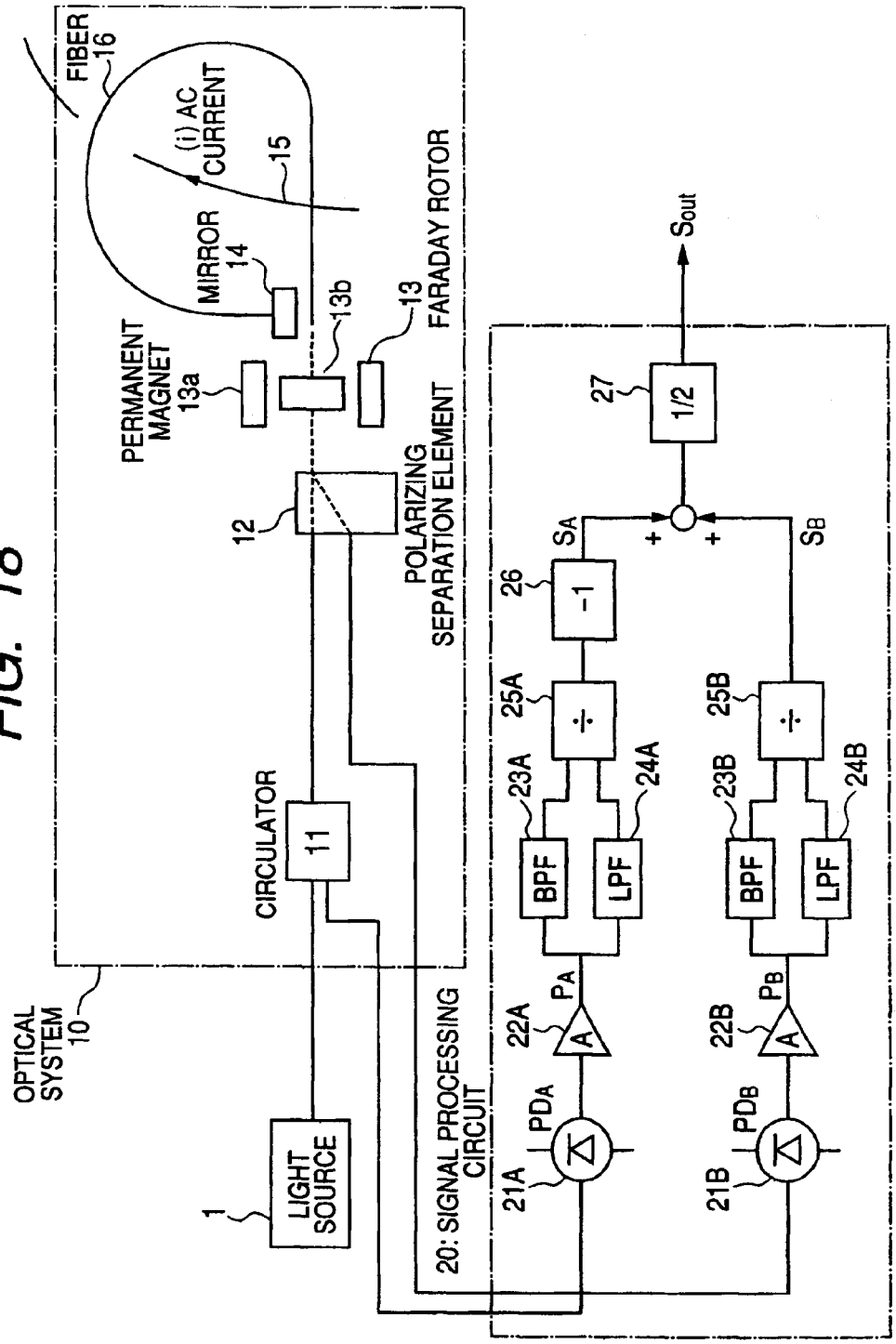
[FIG. 18] It is a configurational diagram showing a prior-art example.
Figure 19:
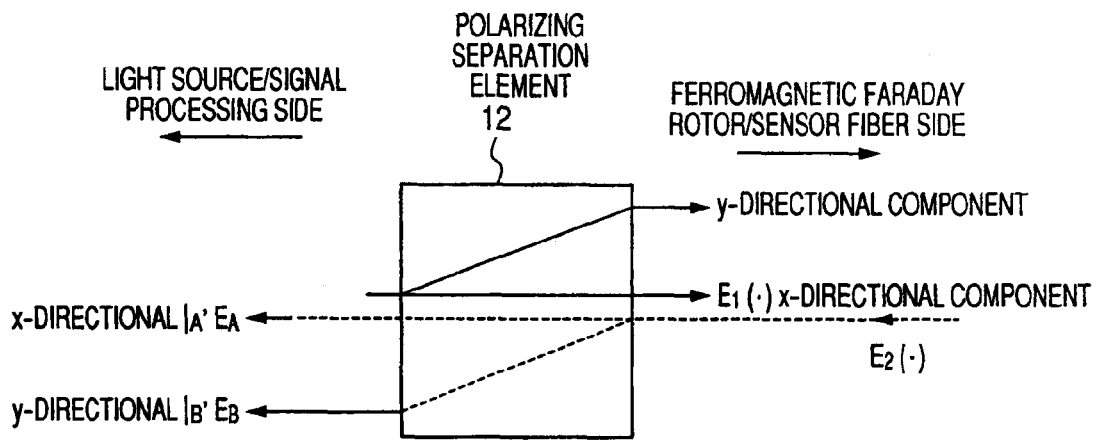
[FIG. 19] It is a diagram for explaining a polarized state in the vicinity of a polarizing separation element shown in FIG. 18.
Figure 20:
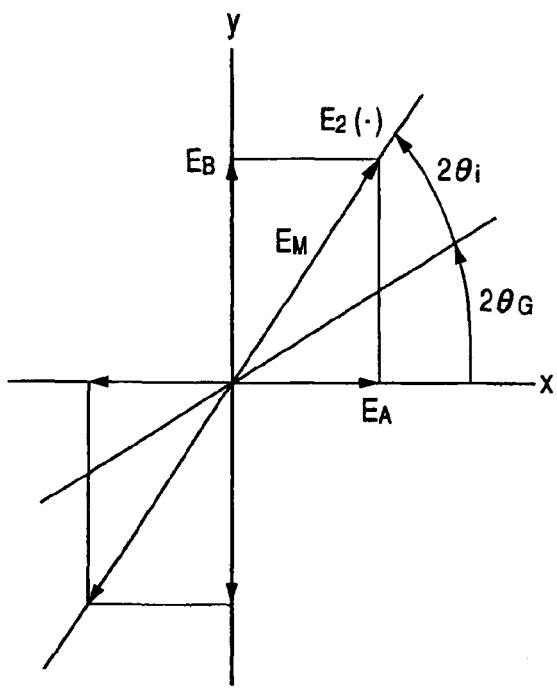
[FIG. 20] It is a diagram for explaining an optical signal component in FIG. 19.

Now, let's consider a condition in which the temperature dependence of the signal $S_A$ or $S_B$ becomes zero in FIG. 18 referred to before. Incidentally, the significances of individual signs are as indicated in Sectors 0008 and 0010.

In this case, in the foregoing formulas (9a) and (9b)

$$S_A = (1+\alpha T) \bullet 4V_s I_0 \cos \omega t/(1-4\beta F_s d\, T) \quad (9a)$$

$$S_B = (1+\alpha T) \bullet 4V_s I_0 \cos \omega t/(1-4\beta F_s d\, T) \quad (9b)$$

$|\alpha T| \ll 1$, $|4\beta F_s d\, T| \ll 1$ is assumed. Then, Formula (9a) is simplified as follows:

$$\begin{aligned}
S_A &= (1+\alpha T)\cdot 4V_s I_0 \cos\omega t / (1-4\beta F_s dT) \\
&\approx 1+\alpha T)(1+4\beta F_s dT)\cdot 4V_s I_0 \cos\omega t \\
&= (1+\alpha T + 4\beta F_s dT + 4\alpha\beta F_s dT^2)\cdot 4V_s I_0 \cos\omega t \\
&\approx (1+\alpha T + 4\beta F_s dT)\cdot 4V_s I_0 \cos\omega t \\
&= \{1+(\alpha+4\beta F_s d)T\}\cdot 4V_s I_0 \cos\omega t
\end{aligned} \quad (34a)$$

Likewise, the signal $S_B$ is expressed as the following formula:

$$S_B = \{1+(\alpha-4\beta F_s d)T\}\bullet 4V_s I_0 \cos \omega t \quad (34b)$$

From Formulas (9a) and (9b) or Formula (34a), the condition in which the temperature dependence of $S_A$ becomes zero is:

$$\alpha = -4\beta F_s d \quad (35a)$$

The condition in which the temperature dependence of $S_B$ becomes zero is:

$$\alpha = 4\beta F_s d \quad (35b)$$

In general, the optical bias at the reference temperature is set to be plus. From the foregoing formula (5a), therefore, $$F_s d = \pi/8$$

holds (a case where the optical bias is minus will be stated later).

In view of Formulas (35a) and (35b), regarding one set of the plus and minus signs of $\alpha$ and $\beta$, it is understood that different results are obtained as to:
a) whether or not the temperature dependence of the modulation signal $S_A$ in FIG. 18 can be adjusted to zero, and
b) whether or not the temperature dependence of the modulation signal $S_B$ in FIG. 18 can be adjusted to zero.

Regarding one set of the plus and minus signs of $\alpha$ and $\beta$, the temperature dependences of both $S_A$ and $S_B$ cannot be adjusted to zero. The reason therefor is that, in a case where either (35a) or (35b) holds and where the second term in the brackets {*} of either of (34a) and (34b) becomes zero, the second term in the brackets {*} of the other becomes $2\alpha$. That is, when the temperature dependence of either $S_A$ or $S_B$ is adjusted to zero, that of the other becomes double the temperature dependence of the double Verdet constant of the sensor element.

More specifically, when $$S_A \text{ or } S_B = 4\,V_s\,I_0 \cos \omega t \quad (36a)$$

holds, the following holds:

$$S_A \text{ or } S_B = (1+2\alpha T)\bullet 4V_s I_0 \cos \omega t \quad (36b)$$

Further, when the mean processing of the modulation degrees is executed under the above condition, the final output $S_{out}$ in that case becomes:

$$S_{out} = 1/2 \left\{ \begin{array}{l} \text{right side of Formula(36}a) + \\ \text{right side of Formula(36}b) \end{array} \right\} \quad (36c)$$
$$= (1+\alpha T)\cdot 4\,V_s I_0 \cos\omega t$$

That is, even when $\beta=0$ is set using the garnet which has quite no temperature characteristic, the influence of $\alpha$ remains.

It is understood from the above that the relations among the parameters and the signal to-be-selected are classified as shown in FIG. 6, in accordance with the signs of $\alpha$ and $\beta$ as to if the temperature dependence of $S_A$ can be made zero or if the temperature dependence of $S_B$= can be made zero.

In the case where the temperature coefficient of the Faraday rotatability of the garnet is zero, that is, when $\beta=0$ is substituted into Formulas (34a) and (34b), the following holds:

$$S_A = (1+\alpha T)\bullet 4V_s I_0 \cos \omega t \quad (7a)$$

$$S_B = (1+\alpha T)\bullet 4V_s I_0 \cos \Omega t \quad (37b)$$

Besides, assuming that the mean processing of the modulation degrees is executed using these signals, the resulting output $S_{out}$ becomes:

$$S_{out}=(S_A+S_B)/2=(1+\alpha T)\bullet 4V_s I_0 \cos \omega t \quad (37c)$$

It is accordingly understood that, in the case where the temperature dependence of the garnet is zero, namely, where $\beta=0$ holds, the temperature-dependence coefficients of all of $S_A$, $S_B$ and $S_{out}$ become equal to the temperature coefficient $\alpha$ of the Verdet constant of the sensor element.

Accordingly, those ranges of the parameters in which the scheme I wherein the optical bias is plus in the reflection type stated before becomes valid have values with which the temperature-dependence coefficient of the system output $S_A$ or $S_B$ lies within a range of $-|\alpha|$ to $+|\alpha|$. That is, the ranges become a range satisfying either of the following formulas, in conformity with Formula (34a) or (34b):

From Formula (34a), $$(0\leq)|\alpha+4\beta F_s d|\leq|\alpha| \text{ (the temperature dependence of } S_A \text{ is less than } |\alpha|) \quad (38a)$$

$$(0\leq)|\alpha-4\beta F_s d|\leq|\alpha| \text{ (the temperature dependence of } S_B \text{ is less than } |\alpha|) \quad (38b)$$

The concrete values of the parameters satisfying Formulas (38a) and (38b) will be obtained below.

(1) In case of $0\leq\alpha$

The relations among $\alpha$, $\beta$ and F are obtained from Formula (38a).

(1-a) Valid range for $S_A$:

(1-a-1) In a case where $\alpha+4\beta F_s d$ is plus, Formula (38a) becomes:

$$0\leq\alpha+4\beta F_s d\leq|\alpha|$$

and the following holds:

$$-\alpha\leq\alpha+4\beta F_s d\leq|\alpha|-\alpha$$

$$-|\alpha|/4d\leq\beta F_s\leq 0 \quad (39a)$$

(1-a-2) In a case where $\alpha+4\beta F_s d$ is minus, Formula (38a) becomes:

$$0\leq\alpha+4\beta F_s d\leq|\alpha|$$

and the following holds:

$$-2|\alpha|\leq 4\beta F_s d\leq -|\alpha|$$

$$-|\alpha|/2d\leq\beta F_s\leq -|\alpha|/4d \quad (39b)$$

(1-b) Valid range for $S_B$:

From Formula (38b), $0\leq|\alpha-4\beta F_s d|\leq|\alpha|$ holds.

(1-b-1) In a case where $\alpha-4\beta F_s d$ is plus, the following holds:

$$0\leq\alpha-4\beta F_s d\leq|\alpha|$$

$$-\alpha\leq -4\beta F_s d\leq|\alpha|-\alpha$$

$$0\leq 4\beta F_s d\leq\alpha/4d \quad (39c)$$

(1-b-2) In a case where $\alpha"4\beta F_s d$ is minus, the following holds:

$$0\leq-(\alpha-4\beta F_s d)\leq|\alpha|$$

$$\alpha\leq 4\beta F_s d\leq|\alpha|+\alpha=2|\alpha|$$

Accordingly, the following holds:

$$\alpha/4d\leq\beta F_s\leq\alpha/2d \quad (39d)$$

(2) In case of $\alpha\leq 0$ (2-a) Valid range for $S_A$:

(2-a-1) In a case where $\alpha+4\beta F_s d$ is plus, the following holds:

$$0\leq|\alpha+4\beta F_s d|\leq|\alpha|$$

Here, $\alpha=-|\alpha|$ holds, and hence, the following holds:

$$0\leq(-|\alpha|+4\beta F_s d)\leq|\alpha|$$

$$|\alpha|\leq 4\beta F_s d\leq 2|\alpha|$$

$$|\alpha|/4d\leq\beta F_s\leq|\alpha|/2d \quad (39e)$$

(2-a-2) In a case where $\alpha+4\beta F_s d$ is minus, the following holds:

$$0\leq-(\alpha+4\beta F_s d)\leq|\alpha|$$

From $\alpha=-|\alpha|$, the following holds:

$$0\leq(|\alpha|-4\beta F_s d)\leq|\alpha|$$

$$-|\alpha|\leq -4\beta F_s d\leq 0$$

$$0\leq 4\beta F_s d\leq|\alpha|$$

$$0\leq\beta F_s\leq|\alpha|/4d \quad (39f)$$

(2-b) Valid range for $S_B$:

(2-b-1) In a case where $\alpha-4\beta F_s d$ is plus, the following holds:

$$0\leq(\alpha-4\beta F_s d)\leq|\alpha|$$

From $\alpha=-|\alpha|$, the following holds:

$$0\leq-|\alpha|-4\beta F_s d\leq|\alpha|$$

$$|\alpha|\leq -|\alpha|-4\beta F_s d\leq 2|\alpha|$$

$$-|\alpha|/2d\leq 4\beta F_s d\leq -|\alpha|/4d \quad (39g)$$

(2-b-2) In a case where $\alpha-4\beta F_s d$ is minus, the following holds:

$$0\leq-(\alpha-4\beta F_s d)\leq|\alpha|$$

From $\alpha=-|\alpha|$, the following holds:

$$0\leq|\alpha|+4\beta F_s d\leq|\alpha|$$

$$-|\alpha|\leq 4\beta F_s d\leq 0$$

$$-|\alpha|/4d\leq\beta F_s\leq 0 \quad (39h)$$

The above formulas (38a), (38b), and (39a)-(39h) are put together as shown in FIG. 7.

In the above, the case of the reflection type (scheme I) has been described. Next, the case of the transmission type will be described.

The whole configuration of the transmission type becomes as shown in FIG. 8. Incidentally, numeral 1 in FIG. 8 designates a light source, numeral 12 a polarizing separation element, numeral 13 a Faraday rotor (garnet), numeral 16 a fiber sensor, numeral 17 an entrance polarizer, each sign PD a light receiving element, each sign BPF a band-pass filter, and each sign LPF a low-pass filter.

Figures 9, 10:
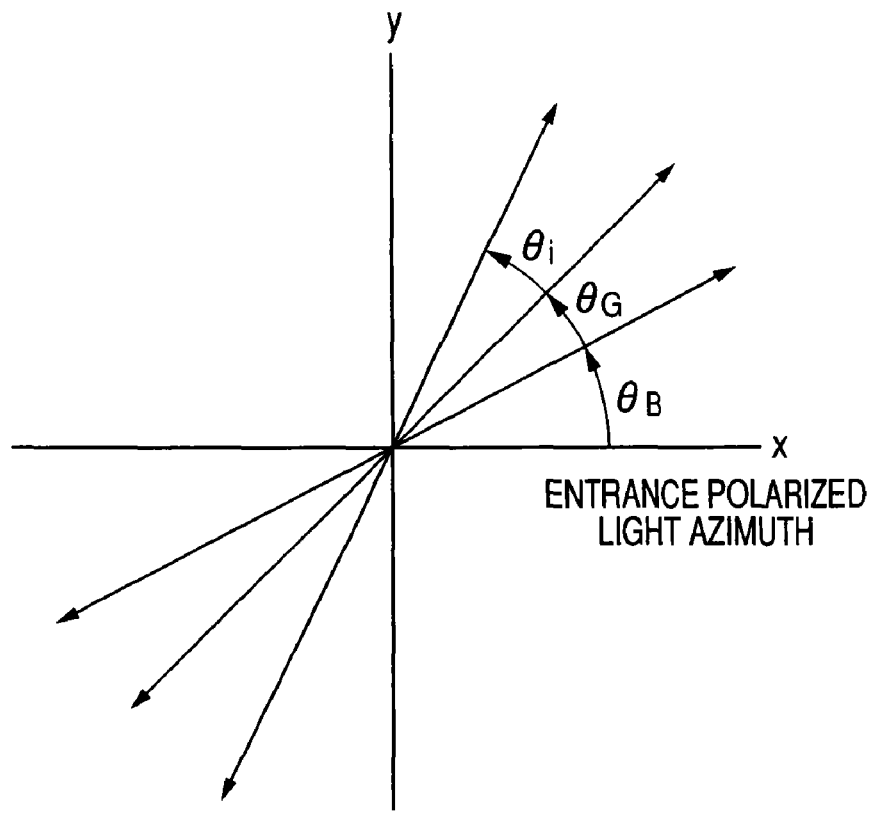
[FIG. 9] It is a diagram for explaining the polarization azimuth of light which enters a polarizing separation element.
[FIG. 10] It is a diagram for explaining the relationship among parameters and signals to-be-selected in the case of a scheme II.

Now, letting $\theta_G$ (rad) denote the rotation angle (Faraday rotation angle) of a polarization plane based on the Faraday rotor (garnet), $\theta_B$ (rad) denote the inclination angle of the principal axis of the polarizing separation element relative to the principal axis of the entrance polarizer, and $\theta_i$ (rad) denote a Faraday rotation angle which arises in the sensor fiber, the polarization azimuth of light entering the polarizing separation element becomes as shown in FIG. 9. Besides, the outputs $P_A$ and $P_B$ of the polarizing separation element are expressed as follows:

$$P_A = A' \cos^2(\theta_B + \theta_G + \theta_i) = A\{1 + \cos 2(\theta_B + \theta_G + \theta_i)\}$$

where $A = A'/2$ (40a)

$$P_B = B' \sin^2(\theta_B + \theta_G + \theta_i) = B\{1 - \cos 2(\theta_B + \theta_G + \theta_i)\}$$

where $B = B'/2$ (40b)

Here, letting i denote a current to-be-measured, and V denote a Verdet constant, the following holds:

$$\theta_i = Vi = V I_0 \cos \omega t \quad (41)$$

The foregoing formulas (3) and (4) are written again:

$$V = (1 + \alpha T) V_s \quad (3)$$

$$\theta_G = (1 + \beta T) F_s d \quad (4)$$

Besides, from the optical bias $2(\theta_B + F_s d) = \pi/2$, the following holds:

$$\theta_B + F_s d = \pi/4 \quad (42)$$

Formulas (3), (4), (41) and (42) are substituted into Formulas (40a) and (40b)

$$\begin{aligned} P_A &= A[1 + \cos 2\{\theta_B + F_s d + \beta F_s dT + (1+\alpha T) V_s I_0 \cos \omega t\}] \\ &= A[1 + \cos\{\pi/2 + 2\beta F_s dT + (1+\alpha T) 2 V_s I_0 \cos \omega t\}] \\ &= A[1 - \sin\{2\beta F_s dT + (1+\alpha T) \cdot 2 V_s I_0 \cos \omega t\}] \end{aligned} \quad (43a)$$

$$P_B = B[1 + \sin\{2\beta F_s dT + (1+\alpha T) \cdot 2 V_s I_0 \cos \omega t\}] \quad (43b)$$

When $|[*]|$ in sin $[*]$ is assumed to be $|[*]| < < \pi/2$, the following holds:

$$P_A = A\{(1 - 2\beta F_s dT) - (1+\alpha T) \bullet 2 V_s I_0 \cos \omega t\} \quad (44a)$$

$$P_B = B\{(1 + 2\beta F_s dT) + (1+\alpha T) \bullet 2 V_s I_0 \cos \omega t\} \quad (44b)$$

$$[P_A]_{DC} = A(1 - 2\beta F_s dT) \quad (45a)$$

$$[P_A]_{AC} = -A(1+\alpha T) \bullet 2 V_s I_0 \cos \omega t\} \quad (45b)$$

$$[P_B]_{DC} = B(1 - 2\beta F_s dT) \quad (45c)$$

$$[P_B]_{AC} = -B(1+\alpha T) \bullet 2 V_s I_0 \cos \omega t\} \quad (45d)$$

From Formulas (45), the following holds:

$$\begin{aligned} S_A &= -1 \times [P_A]_{AC} / [P_A]_{DC} \\ &= (1+\alpha T) \cdot 2 V_s I_0 \cos \omega t / (1 - 2\beta F_s dT) \end{aligned} \quad (46a)$$

$$\begin{aligned} S_B &= [P_B]_{AC} / [P_B]_{DC} \\ &= (1+\alpha T) \cdot 2 V_s I_0 \cos \omega t / (1 + 2\beta F_s dT) \end{aligned} \quad (46b)$$

Formulas (46a) and (46b) are further reduced assuming $|\alpha T| << 1$ and $|2\beta F_s d T| << 1$ as in the case of the reflection type.

$$\begin{aligned} S_A &= (1+\alpha T) \cdot 2 V_s I_0 \cos \omega t / (1 - 2\beta F_s dT) \\ &\approx (1+\alpha T)(1 - 2\beta F_s dT) \cdot 2 V_s I_0 \cos \omega t \\ &\approx \{1 + (\alpha + 2\beta F_s d)T\} \cdot 2 V_s I_0 \cos \omega t \end{aligned} \quad (47a)$$

$$\begin{aligned} S_B &= (1+\alpha T) \cdot 2 V_s I_0 \cos \omega t / (1 + 2\beta F_s dT) \\ &\approx (1+\alpha T)(1 - 2\beta F_s dT) \cdot 2 V_s I_0 \cos \omega t \\ &\approx \{1 + (\alpha - 2\beta F_s d)T\} \cdot 2 V_s I_0 \cos \omega t \end{aligned} \quad (47b)$$

In conformity with (47a), a condition in which the temperature dependence of $S_A$ becomes zero is:

$$\alpha = -2 \beta F_s d \quad (48a)$$

and in conformity with (47b), a condition in which the temperature dependence of $S_B$ becomes zero is:

$$\alpha = 2 \beta F_s d \quad (48b)$$

Next, let's consider the relations among the signs of the respective parameters and the temperature dependences of the signals $S_A$ and $S_B$.

First, there will be considered a case where the optical bias is $+\pi/2$, namely, where $\theta_B + F_s d = \pi/4$ (a case where $\theta_B + F_s d = -\pi/4$ will be separately studied).

In view of both the formulas (48a) and (48b), it is understood that, regarding one set of the signs of the three parameters $\alpha$, $F_s$ and $\beta$, results are different as to whether or not the temperature dependence of the modulation signal $S_A$ in FIG. 8 can be adjusted to zero, and whether or not the temperature dependence of the modulation signal $S_B$ can be adjusted to zero.

Incidentally, the temperature dependences of both $S_A$ and $S_B$ cannot be made zero as regards one set of the signs of $\alpha$, $F_s$ and $\beta$. The reason therefor is that, in a case where the second term in the brackets $\{*\}$ of one of both the formulas (47a) and (47b), the second term in the brackets $\{*\}$ of the other formula becomes $2\alpha$. That is, it is understood that, when the temperature dependence of either $S_A$ or $S_B$ is adjusted to zero, the other exhibits double the temperature dependence of the Verdet constant of the sensor element. More specifically, when:

$$S_A \text{ or } S_B = 2 V_s I_0 \cos \omega t \quad (49a)$$

holds, the following holds:

$$S_B \text{ or } S_A = (1 + 2\alpha T) \bullet 2 V_s I_0 \cos \omega t \quad (49b)$$

Further, when the mean processing of the modulation degrees is executed under the above conditions, the final output $S_{out}$ becomes:

$$\begin{aligned} S_{out} &= \{\text{right side of Formula (49a)} + \text{right side of} \\ &\quad \text{Formula (49b)}\}/2 \\ &= (1 + 2\alpha T) \cdot 2 V_s I_0 \cos \omega t \end{aligned} \quad (49c)$$

That is, even when $\beta=0$ is set, the influence of $\alpha$ remains. The relations among the signs of the respective parameters $\alpha$, $F_s$ and $\beta$ and the signal to-be-selected become as shown in FIG. 10.

Here, let's consider those ranges of the parameters in which the scheme II wherein the optical bias is plus in the transmission type becomes valid.

In the case where the temperature coefficient of the Faraday rotatability of the garnet is zero, that is, when $\beta=0$ is substituted into the foregoing formulas (47a) and (47b), the following holds:

$$S_A = (1+\alpha T) \bullet 2\, V_s I_0 \cos \omega t \qquad (50a)$$

$$S_B = (1+\alpha T) \bullet 2\, V_s I_0 \cos \omega t \qquad (50b)$$

When the mean processing of the modulation degrees is executed using these two signals, the resulting output $S_{out}$ becomes:

$$S_{out} = (S_A + S_B)/2 \qquad (50c)$$
$$= (1+\alpha T) \cdot 2 V_s I_0 \cos \omega t$$

It is understood from the above formulas (50a), (50b) and (50c) that, in the case where the temperature dependence of the garnet is zero, namely, where $\beta=0$ holds, the temperature-dependence coefficients of all of $S_A$, $S_B$ and $S_{out}$ become equal to the temperature-dependence coefficient $\alpha$ of the Verdet constant of the sensor element.

Accordingly, the ranges in which the transmission type becomes valid become a case where the temperature-dependence coefficient of the system output $S_A$ or $S_B$ lies in a range of $-|\alpha|$ to $|\alpha|$, that is, a range in which either of the following formulas is met, from Formulas (47a) and (47b):

From Formula (47a), $$(0<<)|\alpha+\beta F_s d|<<|\alpha| \qquad (51a)$$

From Formula (47b), $$(0<<)|\alpha-\beta F_s d|<<|\alpha| \qquad (51b)$$

Further, there is the relation of Formula (42); $F_s d = \pi/4 - \theta_B$ which does not exist in the reflection type.

Concrete parameter values which meet (51a) and (51b) will be obtained below.

(1) In case of $0 \leq \alpha$

The relations among $\alpha$, $\beta$ and $F_s$ are obtained from Formula (51a).

(1-a) Valid range for $S_A$:

(1-a-1) In a case where $\alpha+2\beta F_s d$ is plus, Formula (51a) becomes:

$$0 \leq \alpha+2\beta F_s d \leq |\alpha|$$

and the following holds:

$$-\alpha \leq 2\beta F_s d \leq |\alpha|-\alpha$$

$$-|\alpha|/2d \leq \beta F_s \leq 0 \qquad (52a)$$

(1-a-2) In a case where $\alpha+2\beta F_s d$ is minus, Formula (51a) becomes:

$$0 \leq \alpha+2\beta F_s d \leq |\alpha|$$

and the following holds:

$$-2|\alpha| \leq 2\beta F_s d \leq -|\alpha|$$

$$-|\alpha|/d \leq \beta F_s \leq -|\alpha|/2d \qquad (52b)$$

(1-b) Valid range for $S_B$:

From Formula (51b), $0 \leq |\alpha-2\beta F_s d| \leq |\alpha|$ holds.

(1-b-1) In a case where $\alpha-2\beta F_s d$ is plus, the following holds:

$$0 \leq \alpha-2\beta F_s d \leq |\alpha|$$

$$-\alpha \leq -2\beta F_s d \leq |\alpha|-\alpha$$

$$0 \leq \beta F_s \leq |\alpha|/2d \qquad (52c)$$

(1-b-2) In a case where $\alpha-2\beta F_s d$ is minus, the following holds:

$$0 \leq -(\alpha-2\beta F_s d) \leq |\alpha|$$

$$|\alpha| \leq 2\beta F_s d \leq |\alpha|+\alpha=2|\alpha|$$

Accordingly, the following holds:

$$|\alpha|/2d \leq \beta F_s \leq |\alpha|/d \qquad (52d)$$

(2) In case of $\alpha \leq 0$ (2-a) Valid range for $S_A$:

(2-a-1) In a case where $\alpha+2\beta F_s d$ is plus, the following holds:

$$0 \leq |\alpha+2\beta F_s d| \leq |\alpha|$$

Here, $\alpha = -|\alpha|$ holds, and hence, the following holds:

$$0 \leq -|\alpha|+2\beta F_s d \leq |\alpha|$$

$$|\alpha| \leq 2\beta F_s d \leq 2|\alpha|$$

$$|\alpha|/2d \leq \beta F_s \leq |\alpha|/d \qquad (52e)$$

(2-a-2) In a case where $\alpha+2\beta F_s d$ is minus, the following holds:

$$0 \leq -(\alpha+2\beta F_s d) \leq |\alpha|$$

From $\alpha = -|\alpha|$, the following holds:

$$0 \leq (|\alpha|-2\beta F_s d) \leq |\alpha|$$

$$-|\alpha| \leq -2\beta F_s d \leq 0$$

$$0 \leq 2\beta F_s d \leq |\alpha|$$

$$0 \leq \beta F_s \leq |\alpha|/2d \qquad (52f)$$

(2-b) Valid range for $S_B$:

(2-b-1) In a case where $\alpha-2\beta F_s d$ is plus, the following holds:

$$0 \leq (\alpha-2\beta F_s d) \leq |\alpha|$$

From $\alpha = -|\alpha|$, the following holds:

$$0 \leq -|\alpha|-2\beta F_s d \leq |\alpha|$$

$$|\alpha| \leq -2\beta F_s d \leq 2|\alpha|$$

$$-|\alpha|/d \leq 2\beta F_s d \leq -|\alpha|/2d \qquad (52g)$$

(2-b-2) In a case where $\alpha-2\beta F_s d$ is minus, the following holds:

$$0 \leq -(\alpha-2\beta F_s d) \leq |\alpha|$$

From $\alpha = -|\alpha|$, the following holds:

$$0 \leq |\alpha|+2\beta F_s d \leq |\alpha|$$

$$-|\alpha| \leq 2\beta F_s d \leq 0$$

$$-|\alpha|/2d \leq \beta F_s \leq 0 \qquad (52h)$$

The above formulas (51a), (51b), and (52a)-(52h) are put together as shown in FIG. 11.

Thus far, the description has been made assuming that the optical bias is plus, namely, that the following holds as in the foregoing formula (5a):

$$F_s d = +\pi/8$$

but the optical bias can also be set minus. In this case, the optical bias becomes:

$$F_s d = -\pi/8 \qquad (53)$$

When Formula (53) is substituted into the foregoing formulas (6) and (8) instead of Formula (5a), the foregoing formulas (9a) and (9b) become the following (54a) and (54b), respectively:

$$S_A = -(1+\alpha T) \bullet 4 \, V_s I_0 \cos \omega t / (1 + 4\beta F_s d\, T) \qquad (54a)$$

$$S_B = -(1+\alpha T) \bullet 4 \, V_s I_0 \cos \omega t / (1 - 4\beta F_s d\, T) \qquad (54b)$$

When Formulas (9a) and (54a) and Formulas (9b) and (54b) are respectively compared, (54a) becomes Formula (9b) with the minus sign assigned thereto, and (54b) becomes Formula (9a) with the minus sign assigned thereto. These relations are shown in FIG. 12.

When the optical bias is changed from plus into minus as stated above, the following facts can be said:
1. When the optical bias is changed from plus into minus, the polarities of $S_A$ and $S_B$ with respect to the current to-be-measured become opposite.
2. FIG. 6 referred to before changes into FIG. 13 (A and B may be replaced).
3. FIG. 7 referred to before changes into FIG. 14 (A and B may be replaced).

The relations among the signs of the respective parameters $\alpha$, $F_s$ and $\beta$ and the signal to-be-selected become as shown in FIG. 14.

Here, let's consider those ranges of the parameters in which the scheme III wherein the optical bias is minus in the reflection type becomes valid.

Formulas (54a) and (54b) are reduced as in the cases of Formulas (34a) and (34b).

$$\begin{aligned} S_A &= -(1+\alpha T) \cdot 4 V_s I_0 \cos\omega t / (1 + 4\beta F_s dT) \\ &\approx -(1+\alpha T)(1 - 4\beta F_s dT) \cdot 4 V_s I_0 \cos\omega t \\ &\approx -\{1 + (\alpha - 4\beta F_s d)T\} \cdot 4 V_s I_0 \cos\omega t \end{aligned} \qquad (55a)$$

Likewise, $S_B$ becomes the following formula:

$$S_B \approx -\{1+(\alpha + 4\beta F_s d)T\} \bullet 4 \, V_s I_0 \cos \omega t \qquad (55b)$$

From the above formulas (55a) and (55b), a conditional formula determining those ranges of the parameters in which the scheme III becomes valid lies in a range which meets either of the following formulas:

From Formula (55a), $$(0<<)|(\alpha - 4\beta F_s d)|<<|\alpha| \text{ (the temperature-dependence coefficient of } S_A \text{ is less than } |\alpha|) \qquad (56a)$$

From Formula (55b), $$(0<<)|(\alpha + 4\beta F_s d)|<<|\alpha| \text{ (the temperature-dependence coefficient of } S_B \text{ is less than } |\alpha|) \qquad (56b)$$

When Formulas (56a) and (56b) are respectively compared with Formulas (38a) and (38b), it is understood that they differ only in the point of the replacement of the suffixes A and B from each other. Accordingly, the concrete formulas of the parameter values meeting Formulas (56a) and (56b) become as indicated in FIG. 14, by reference to FIG. 7.

Next, let's consider a case where the optical bias is minus in the transmission type (scheme IV). In this case, the following holds:

$$\theta_B + F_s d = -\pi/4 \qquad (57)$$

When this formula is used, Formulas (46a) and (46b) become as follows:

$$S_A = -(1+\alpha T) \bullet 2 \, V_s I_0 \cos \omega t / (1 + 2 \beta F_s d\, T) \qquad (58a)$$

$$S_B = -(1+\alpha T) \bullet 2 \, V_s I_0 \cos \omega t / (1 - 2 \beta F_s d\, T) \qquad (58b)$$

When (58a) and (58b) are reduced assuming $|2 \beta F_s d T| << 1$ and $|\alpha T| << 1$, they become the following formulas (59a) and (59b):

$$\begin{aligned} S_A &= -(1+\alpha T)(1 - 2\beta F_s dT) \cdot 2 V_s I_0 \cos\omega t \\ &\approx -\{1 + (\alpha - 2\beta F_s d)T\} \cdot 2 V_s I_0 \cos\omega t \end{aligned} \qquad (59a)$$

$$\begin{aligned} S_B &= -(1+\alpha T) \cdot 2 V_s I_0 \cos\omega t / (1 - 2\beta F_s dT) \\ &\approx -\{1 + (\alpha + 2\beta F_s d)T\} \cdot 2 V_s I_0 \cos\omega t \end{aligned} \qquad (59b)$$

From Formula (59a), a condition in which the temperature dependence of $S_A$ becomes zero is:

$$\alpha = 2 \beta F_s d$$

From Formula (59b), a condition in which the temperature dependence of $S_B$ becomes zero is:

$$\alpha = -2 \beta F_s d$$

When Formulas (47a) and (47b) and Formulas (58a) and (58b) are compared, they are as shown in FIG. 15.

In view of FIG. 15, when the optical bias is altered from plus into minus, Formula (58a) becomes Formula (47b) with the minus sign assigned thereto, and Formula (58b) becomes Formula (47a) with the minus sign assigned thereto, assuming the same configuration as in FIG. 8. For this reason, the following facts can be said:
1) When the optical bias is changed from plus into minus, the polarities of $S_A$ and $S_B$ with respect to the current to-be-measured become opposite.
2) FIG. 10 referred to before changes into FIG. 16.
3) FIG. 11 referred to before changes into FIG. 17.

The relations among the signs of the respective parameters $\alpha$, $F_s$ and $\beta$ and the signal to-be-selected become as shown in FIG. 17.

A conditional formula determining those ranges of the parameters in which the above scheme IV wherein the optical bias is minus in the transmission type becomes valid lies in a range which meets either of the following formulas:

From Formula (59a), $$(0<<)|(\alpha - 2\beta F_s d)|<<|\alpha| \text{ (the temperature-dependence coefficient of } S_A \text{ is less than } |\alpha|) \qquad (60a)$$

From Formula (59b), $$(0<<)|(\alpha + 2\beta F_s d)|<<|\alpha| \text{ (the temperature-dependence coefficient of } S_B \text{ is less than } |\alpha|) \qquad (60b)$$

When Formulas (60a) and (60b) are respectively compared with Formulas (a) and (b), it is understood that they differ only in the point of the replacement of the suffixes A and B from each other. Accordingly, the concrete formulas of the parameter values meeting Formulas (60a) and (60b) become as indicated in FIG. 17, by reference to FIG. 11.

Next, there will be described a case where the optical bias shifts. While the sensor device is classified into the reflection type and the transmission type, the reflection type (scheme V) will be first described.

It is assumed that the optical bias is plus, and that an error δ is involved in $F_s$ d.

$$F_s d = \pi/8 + \delta \quad (61)$$ where $|\delta| \ll \pi/2$ is assumed.

In this case, the foregoing formulas (6a) and (6b) are respectively expressed as (62a) and (62b):

$$P_A = A[1 + \cos\{\pi/2 + 4\delta + 4\beta F_s dT + 4(1+\alpha T)V_s I_0 \cos \omega t\}] \quad (62a)$$

$$P_B = B[1 - \cos\{\pi/2 + 4\delta + 4\beta F_s dT + 4(1+\alpha T)V_s I_0 \cos \omega t\}] \quad (62b)$$

Formula (62a) can be reduced into the following formula:

$$P_A = A[1 - \sin\{(4\delta + 4\beta F_s dT) - 4(1+\alpha T)V_s I_0 \cos\omega t\}] \quad (63a)$$
$$\approx A[\{1 - (4\delta + 4\beta F_s dT)\} - 4(1+\alpha T) \cdot V_s I_0 \cos\omega t]$$

Likewise, (62b) can be reduced into the following formula:

$$P_B \approx B[\{1 + (4\delta + 4\beta F_s dT)\} + 4(1+\alpha T) \bullet V_s I_0 \cos \omega t] \quad (63b)$$

From Formulas (63a) and (63b), $S_A$ and $S_B$ become the following formulas:

$$S_A = (1+\alpha T) \bullet 4 V_s I_0 \cos \omega t / (1 - 4\delta - 4\beta F_s dT) \quad (64a)$$

$$S_A = (1+\alpha T) \bullet 4 V_s I_0 \cos \omega t / (1 + 4\delta + 4\beta F_s dT) \quad (64b)$$

When these are further simplified, the following holds:

$$S_A \approx (1 + 4\delta + 4\beta F_s dT)(1+\alpha T) \bullet 4 V_s I_0 \cos \omega t$$

and when the quadratic term is omitted, $S_A$ becomes the following formula:

$$S_A = \{1 + 4\delta + (\alpha + 4\beta F_s d)T\} \bullet 4 V_s I_0 \cos \omega t \quad (65a)$$

Likewise, $S_B$ becomes the following formula:

$$S_A = \{1 - 4\delta + (\alpha - 4\beta F_s d)T\} \bullet 4 V_s I_0 \cos \omega t \quad (65b)$$

When Formulas (65a) and (65b) are respectively compared with the foregoing formulas (34a) and (34b), influences on the outputs $S_A$ and $S_B$ in the existence of the optical bias shift can be concluded as follows:

a) Sensitivities change.

The sensitivity of $S_A$ changes by $+4\delta$, and the sensitivity of $S_B$ by $-4\delta$.

b) The formulas of optimum solutions do not change.

The term $(\alpha + 4\beta F_s d)T$ of Formula (65a) as expresses the temperature dependence is equal to that of (34a), while the term $(\alpha - 4\beta F_s d)T$ of Formula (65b) as expresses the temperature dependence is equal to that of (34b).

Accordingly, conditional formulas in which the temperature dependences of $S_A$ and $S_B$ become zero are equal to Formulas (35a) and (35b). Therefore, an explanatory diagram which concerns if the temperature dependence of $S_A$ can be made zero or the temperature dependence of $S_B$ can be made zero in accordance with the signs of α and β is the same as FIG. 6.

c) Formulas indicating those ranges of the parameters in which the above scheme V becomes valid do not differ.

Conditional formulas are the same as Formulas (38a) and (38b), and an explanatory diagram is also the same as FIG. 7.

Incidentally, the output signal $S_{out}$ which is obtained by executing the mean processing of the modulation degrees in the case where the optical bias shifts becomes as follows, on the basis of Formulas (65a) and (65b):

$$S_{out} = (S_A + S_B)/2 = \{(65a) + (65b)\}/2 \quad (66)$$
$$= (1 + \alpha T) \cdot 4 V_s I_0 \cos \omega t$$

From this formula (66), the advantages of the mean processing of the modulation degrees are as follows:

The influence of the temperature dependence of the garnet can be eliminated.

The influence of the optical bias shift can be eliminated.

On the other hand, the mean processing of the modulation degrees cannot be said advantageous in the following point:

The influence of the temperature dependence of the Verdet constant of the sensor element cannot be eliminated (refer to the term α T of Formula (66)).

Subsequently, the transmission type (scheme VI) will be described.

It is assumed that the optical bias is plus, and that an error δ is involved in $F_s$ d.

$$\theta_B + F_s d = \pi/4 + \delta \quad (67)$$ where $|\delta| \ll \pi/2$ is assumed.

In this case, the foregoing formulas (43a) and (43b) are respectively expressed as the following (68a) and (68b):

$$P_A = A[1 + \cos\{\pi/2 + 2\delta + 2\beta F_s dT + 2(1+\alpha T)V_s I_0 \cos\omega t\}] \quad (68a)$$
$$\approx A[1 - \sin\{(2\delta + 2\beta F_s dT) - 2(1+\alpha T)V_s I_0 \cos\omega t\}]$$

$$P_B = B[1 - \cos\{\pi/2 + 4\delta + 4\beta F_s dT + 2(1+\alpha T)V_s I_0 \cos\omega t\}] \quad (68b)$$
$$\approx B[\{1 + \sin(2\delta + 2\beta F_s dT)\} + 2(1+\alpha T)V_s I_0 \cos\omega t]$$

Formula (68a) can be reduced into the following formula:

$$P_A \approx A[\{1 - (2\delta + 2\beta F_s dT)\} - 2(1+\alpha T)V_s I_0 \cos \omega t] \quad (69a)$$

Likewise, (68b) can be reduced into the following formula:

$$P_B \approx B[\{1 + (2\delta + 2\beta F_s dT)\} + 2(1+\alpha T)V_s I_0 \cos \omega t] \quad (69b)$$

From Formulas (69a) and (69b), $S_A$ and $S_B$ become the following formulas:

$$S_A = (1+\alpha T) \bullet 2 V_s I_0 \cos \omega t / (1 - 2\delta - 2\beta F_s dT) \quad (70a)$$

$$S_A = (1+\alpha T) \bullet 2 V_s I_0 \cos \omega t / (1 + 2\delta + 2\beta F_s dT) \quad (70b)$$

When these are further simplified, the following holds:

$$S_A \approx (1 + 4\delta + 4\beta F_s dT)(1+\alpha T) \bullet 4 V_s I_0 \cos \omega t$$

and when the quadratic term is omitted, $S_A$ becomes the following formula:

$$S_A = \{1 + 2\delta + (\alpha + 2\beta F_s d)T\} \bullet 2 V_s I_0 \cos \omega t \quad (71a)$$

Likewise, $S_B$ becomes Formula (71b)

$$S_A = \{1 - 2\delta + (\alpha - 2\beta F_s d)T\} \bullet 2 V_s I_0 \cos \omega t \quad (71b)$$

When Formulas (71a) and (71b) are respectively compared with the foregoing formulas (47a) and (47b), influences on the outputs $S_A$ and $S_B$ in the existence of the optical bias shift can be concluded as follows:

a) Sensitivities change.

The sensitivity of $S_A$ changes by $+2\delta$, and the sensitivity of $S_B$ by $-2\delta$.

b) The formulas of optimum solutions do not change.

The term $(\alpha + 2\beta F_s d)T$ of Formula (71a) as expresses the temperature dependence is equal to that of (47a), while the term ($\alpha-2\beta F_s d$)T of Formula (71b) as expresses the temperature dependence is equal to that of (47b).

Accordingly, conditional formulas in which the temperature dependences of $S_A$ and $S_B$ become zero are equal to Formulas (48a) and (48b). Therefore, an explanatory diagram which concerns if the temperature dependence of $S_A$ can be made zero or the temperature dependence of $S_B$ can be made zero in accordance with the signs of $\alpha$ and $\beta$ is the same as FIG. 10.

c) Formulas indicating those ranges of the parameters in which the above scheme V becomes valid do not differ.

Conditional formulas are the same as Formulas (50a) and (50b), and an explanatory diagram is also the same as FIG. 11. However, the foregoing formula (42) is reduced as $F_s d=\pi/4-\theta_B-\delta$.

Incidentally, the output signal $S_{out}$ which is obtained by executing the mean processing of the modulation degrees in the case where the optical bias shifts becomes as follows on the basis of Formulas (71a) and (71b):

$$S_{out} = (S_A + S_B)/2 \qquad (72)$$
$$= \{(71a) + (71b)\}/2$$
$$= (1+\alpha T) \cdot 2V_s I_0 \cos\omega t$$

From this formula (72), the advantages of the mean processing of the modulation degrees are as follows:

The influence of the temperature dependence of the garnet can be eliminated.

The influence of the optical bias shift can be eliminated.

On the other hand, the mean processing of the modulation degrees cannot be said advantageous in the following point:

The influence of the temperature dependence of the Verdet constant of the sensor element cannot be eliminated (refer to the term $\alpha T$ of Formula (72)).

In the preceding sectors, the characteristics have been investigated as to the cases where the optical biases are plus and where they shift. As a result, it has been revealed that, even when the optical biases shift, the formulas indicating the characteristics of the schemes do not differ.

Also cases where the optical biases are minus and where they shift, are considered similarly to the above, and hence, description on the characteristics in these conditions shall be omitted.

The invention claimed is:

1. A method for reducing a temperature-dependent error in a photocurrent sensor, wherein a Faraday effect induced by an AC current to be measured is derived as an intensity modulation signal of light, said method comprising:

inserting a ferromagnetic Faraday rotor into an optical path between a polarizer and an analyzer, one with which a modulation degree indicated by a ratio between an AC component and a DC component becomes constant versus a temperature change when the intensity modulation signal of the light is converted into an electric signal is selected, thereby to reduce a temperature dependence of a sensor output attributed to a temperature dependence of a Verdet constant of the photocurrent sensor.

2. A method for reducing a temperature-dependent error in a photocurrent sensor, wherein a Faraday effect induced by an AC current to-be-measured is derived as an intensity modulation signal of light, said method comprising:

inserting a ferromagnetic Faraday rotor into an optical oath between a polarizer and an analyzer;

selecting a Faraday rotation angle of the ferromagnetic Faraday rotor so that, when the intensity modulation signal of the light is converted into an electric signal, a temperature-dependent change rate of an AC component of the electric signal may become equal to or smaller than a temperature-dependent change rate of a DC component of the electric signal, thereby to reduce a temperature dependence of a sensor output attributed to a temperature dependence of a Verdet constant of the photocurrent sensor.

3. A method for reducing a temperature-dependent error in a photocurrent sensor, wherein a Faraday effect which light passing through a sensor element undergoes when a rectilinear polarization is generated using a polarizer from light emitted from a light source, the rectilinear polarization is passed through the sensor element made of a transparent medium, and a magnetic field induced by an AC current to-be-measured is applied to the sensor element is derived as a signal of light (intensity modulation light) subjected to an intensity modulation by an analyzer, the intensity modulation light is converted into an electric signal, and a modulation degree which is indicated by a ratio between an AC component and a DC component of the electric signal is obtained as an output of the sensor, said method comprising:

inserting a ferromagnetic Faraday rotor which is magnetically saturated into an optical path which extends from the polarizer to the analyzer via the sensor element, and that, as a temperature-dependent value of a Faraday rotation angle which arises in the ferromagnetic Faraday rotor, one with which the modulation degree becomes constant versus a temperature change is selected, thereby to reduce a temperature dependence of the sensor output attributed to a temperature dependence of a Verdet constant of the sensor element.

4. A method for reducing a temperature-dependent error in a photocurrent sensor as defined in claim 3, characterized in that, as the temperature-dependent value of the Faraday rotation angle which arises in the ferromagnetic Faraday rotor, one with which an absolute value of a temperature dependence of the modulation degree becomes smaller than an absolute value of a temperature-dependent of the Verdet constant of the sensor element is selected, thereby to reduce an absolute value of the temperature-dependent error of the sensor output attributed to the temperature dependence of the Verdet constant of the sensor element.

5. A method for reducing a temperature-dependent error in a photocurrent sensor as defined in claim 3, characterized by being so configured that the light emitted from the light source and passed through the polarizer is reflected by a mirror after being passed through the ferromagnetic Faraday rotor and the sensor element, thereby to be returned to the polarizer which serves also as the analyzer, and that the reflected light is passed through the polarizer which serves also as the analyzer, thereby to be derived as the signal of the light subjected to the intensity modulation.

6. A method for reducing a temperature-dependent error in a photocurrent sensor as defined in claim 3, characterized in that the temperature-dependent value of the Faraday rotation angle which arises in the ferromagnetic Faraday rotor meets relations of the following formula (I):

$$-\alpha \leq \alpha \pm 2\beta F_s d \leq \alpha \qquad (I)$$

where $\alpha$ indicates a temperature-dependence coefficient of a Verdet constant of a sensor fiber, $\beta$ indicates a temperature-dependence coefficient of a Faraday rotatability of the ferromagnetic Faraday rotor, $F_s$ indicates the Faraday rotatability of the ferromagnetic Faraday rotor at a reference temperature, and d indicates a thickness of the ferromagnetic Faraday rotor.

7. A method for reducing a temperature-dependent error in a photocurrent sensor as defined in claim 3, characterized in that the temperature-dependent value of the Faraday rotation angle which arises in the ferromagnetic Faraday rotor meets relations of the following formula (II):

$$-\alpha \leq \alpha \pm 4\beta F_s d \leq \alpha \quad (II)$$

where $\alpha$ indicates a temperature-dependence coefficient of a Verdet constant of a sensor fiber, $\beta$ indicates a temperature-dependence coefficient of a Faraday rotatability of the ferromagnetic Faraday rotor, $F_s$ indicates the Faraday rotatability of the ferromagnetic Faraday rotor at a reference temperature, and d indicates a thickness of the ferromagnetic Faraday rotor.

8. A method for reducing a temperature-dependent error in a photocurrent sensor as defined in claim 1, characterized in that the Faraday rotation angle based on the ferromagnetic Faraday rotor and the temperature-dependent value thereof are adjusted by combining a plurality of Faraday rotors whose Faraday rotatabilities and temperature-dependence characteristics are different, and changing thicknesses of the respective rotors.

9. A photocurrent sensor device comprising: conversion means for deriving a Faraday effect induced by an AC current to-be-measured, as an intensity modulation signal of light, and for converting the intensity modulation signal of the light into an electric signal, arithmetic means for extracting an AC component and a DC component of the electric signal and for calculating a modulation degree which is indicated by a ratio between the components, and adjustment means for adjusting a temperature-dependent change rate of the AC component and a temperature-dependent change rate of the DC component so that the former may become equal to or smaller than the latter.

10. A photocurrent sensor device wherein a Faraday effect induced by an AC current to-be-measured is derived as an intensity modulation signal of light, comprising:

a ferromagnetic Faraday rotor which is inserted into an optical path between a polarizer and an analyzer, conversion means for converting an optical signal from the analyzer, into an electric signal, and arithmetic means for extracting an AC component and a DC component of the electric signal and for calculating a modulation degree which is indicated by a ratio between the components, wherein a temperature-dependent value of a Faraday rotation angle which arises in the ferromagnetic Faraday rotor meets relations of the following formula (I):

$$+\alpha \leq \alpha \pm 2\beta F_s d \leq \alpha \quad (I)$$

where $\alpha$ indicates a temperature-dependence coefficient of a Verdet constant of a sensor fiber, $\beta$ indicates a temperature-dependence coefficient of a Faraday rotatability of the ferromagnetic Faraday rotor, $F_s$ indicates the Faraday rotatability of the ferromagnetic Faraday rotor at a reference temperature, and d indicates a thickness of the ferromagnetic Faraday rotor.

11. A photocurrent sensor device wherein a Faraday effect induced by an AC current to-be-measured is derived as an intensity modulation signal of light, comprising:

a polarizer which serves also as an analyzer, a sensor element which has a mirror mounted at one end thereof, a ferromagnetic Faraday rotor which is inserted into an optical path between the polarizer and the sensor element, conversion means for converting an optical signal from the analyzer, into an electric signal, and arithmetic means for extracting an AC component and a DC component of the electric signal and for calculating a modulation degree which is indicated by a ratio between the components, wherein a temperature-dependent value of a Faraday rotation angle which arises in the ferromagnetic Faraday rotor meets relations of the following formula (II):

$$+\alpha \leq \alpha \pm 4\beta F_s d \leq \alpha \quad (II)$$

where $\alpha$ indicates a temperature-dependence coefficient of a Verdet constant of a sensor fiber, $\beta$ indicates a temperature-dependence coefficient of a Faraday rotatability of the ferromagnetic Faraday rotor, $F_s$ indicates the Faraday rotatability of the ferromagnetic Faraday rotor at a reference temperature, and d indicates a thickness of the ferromagnetic Faraday rotor.

12. A photocurrent sensor device as defined in claim 10, characterized in that the Faraday rotation angle based on the ferromagnetic Faraday rotor and the temperature-dependent value thereof are adjusted by combining a plurality of Faraday rotors whose Faraday rotatabilities and temperature-dependence characteristics are different, and changing thicknesses of the respective rotors.

13. A photocurrent sensor device as defined in claim 11, wherein the Faraday rotation angle based on the ferromagnetic Faraday rotor and the temperature-dependent value thereof are adjusted by combining a plurality of Faraday rotors whose Faraday rotatabilities and temperature-dependence characteristics are different, and changing thicknesses of the respective rotors.

14. A method for reducing a temperature-dependent error in a photocurrent sensor as defined in claim 2, wherein the Faraday rotation angle based on the ferromagnetic Faraday rotor and the temperature-dependent value thereof are adjusted by combining a plurality of Faraday rotors whose Faraday rotatabilities and temperature-dependence characteristics are different, and changing thicknesses of the respective rotors.

15. A method for reducing a temperature-dependent error in a photocurrent sensor as defined in claim 3, wherein the Faraday rotation angle based on the ferromagnetic Faraday rotor and the temperature-dependent value thereof are adjusted by combining a plurality of Faraday rotors whose Faraday rotatabilities and temperature-dependence characteristics are different, and changing thicknesses of the respective rotors.

* * * * *